US012738334B2

(12) United States Patent
Guo et al.

(10) Patent No.: US 12,738,334 B2
(45) Date of Patent: Sep. 15, 2026

(54) MEMORY DEVICES, MEMORY SYSTEMS, AND CONTROL METHODS THEREOF TO IDENTIFY A PROGRAMMING FAILURE

(71) Applicant: Yangtze Memory Technologies Co., Ltd., Wuhan (CN)

(72) Inventors: Lu Guo, Wuhan (CN); Weijun Wan, Wuhan (CN); Wei Huang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 18/672,925

(22) Filed: May 23, 2024

(65) Prior Publication Data

US 2025/0273280 A1 Aug. 28, 2025

(30) Foreign Application Priority Data

Feb. 28, 2024 (CN) ........................ 202410224864.5

(51) Int. Cl.
*G11C 16/34* (2006.01)
*G11C 16/10* (2006.01)

(52) U.S. Cl.
CPC ........ *G11C 16/3459* (2013.01); *G11C 16/102* (2013.01); *G11C 16/3404* (2013.01)

(58) Field of Classification Search
None
See application file for complete search history.

(56) References Cited

U.S. PATENT DOCUMENTS

2019/0115081 A1* 4/2019 Lee .................... G11C 16/3459

* cited by examiner

*Primary Examiner* — Alfredo Bermudez Lozada
(74) *Attorney, Agent, or Firm* — Hanley, Flight & Zimmerman, LLC

(57) ABSTRACT

A memory device, a memory system and a control method thereof to identify a programming state of memory cells includes an example memory device with a memory block including a plurality of memory cells; a plurality of word lines coupled to the memory block; and a peripheral circuit coupled to the plurality of word lines and configured to: perform a first programming operation in response to a first operation command to program first memory cells; perform a first verification operation to obtain the first number of second memory cells that are coupled to the first word line, have an erased state as the target state and have a threshold voltage larger than a first verification voltage, which is a verification voltage of the first programmed state; and generate a first state identifier indicating a programming failure in response to the first number being larger than a first threshold.

20 Claims, 16 Drawing Sheets

MEMORY DEVICES, MEMORY SYSTEMS, AND CONTROL METHODS THEREOF TO IDENTIFY A PROGRAMMING FAILURE

CROSS-REFERENCE TO RELATED APPLICATION

The present application claims the benefit of priority to China Application No. 202410224864.5, filed on Feb. 28, 2024, the content of which is incorporated herein by reference in its entirety.

TECHNICAL FIELD

Implementations of the present disclosure relate to the field of semiconductor technology, and in examples to memory devices and control methods thereof and to memory systems and control methods thereof.

BACKGROUND

A memory device is a storage apparatus for saving information in modern information technology. As a typical nonvolatile semiconductor memory, a NAND (Not-And) type memory is becoming a mainstream product in the market of storage due to its relatively high storage density, controllable production costs, appropriate program and erase speeds and retention characteristics.

DETAILED DESCRIPTION

Figure 1:
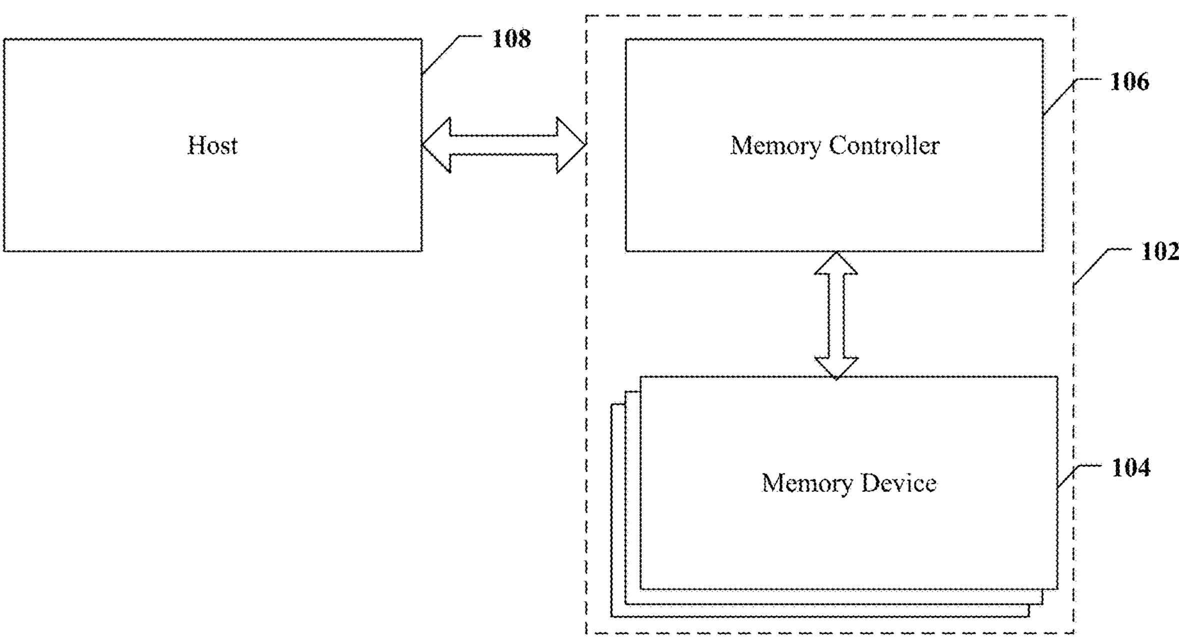
FIG. 1 shows a schematic diagram of an example system according to an implementation of the disclosure.

Hereinafter, example implementations disclosed by the present disclosure will be described in more detail with reference to accompanying drawings. Although example implementations of the present disclosure are illustrated in accompanying drawings, it should be understood that the present disclosure can be embodied in various forms and is not limited to specific implementations described herein. On the contrary, the implementations are provided for more thorough understanding of the present disclosure and to convey the scope disclosed by the present disclosure fully to those skilled in the art.

In the description hereafter, many specific details are provided to facilitate more thorough understanding of the present disclosure. However, it is apparent for those skilled in the art that the present disclosure can be implemented without one or more of these details. In other examples, in order not to obscure the present disclosure, some technical features well known in the art will not be described. That is to say, not all features of practical implementations will be described herein and well-known functions and structures will not be described in detail.

It should be appreciated that when an element or a layer is said to be "over", "adjacent to", "connected to" or "coupled to" another element or layer, it may be directly over, adjacent to, connected to or coupled to the another element or layer or an intervening element or layer may exist therebetween. It should be appreciated that although various elements, components, regions, layers and/or parts may be described using terms "first", "second", "third" or the like, they are not limited by those terms. The terms are only used to distinguish one element, component, region, layer or part from another element, component, region, layer or part. Therefore, a first element, component, region, layer or part discussed hereafter may be instead expressed as a second element, component, region, layer or part without departing from the teaching of the present disclosure. When a second element, component, region, layer or part is in discussion, it is not intended to indicate that a first element, component, region, layer or part must exist.

Terminology is used herein only for description of specific implementations and in no way for limiting the present disclosure. As used herein, the terms "a", "an" and "the" in singular forms are also intended to cover plural forms, unless the context clearly indicates otherwise. It is also be appreciated that terms "comprise", "comprising", "include" and/or "including", as used in the specification, specify presence of the mentioned features, integers, steps, operations, elements and/or components, but do not exclude presence or addition of one or more other features, integers, steps, operations, elements, components and/or combinations thereof. As used herein, the term "and/or" includes any and all combinations of relevant listed items.

It can be understood that "some implementation" or "an implementation" mentioned throughout the specification means that particular features, structures or characteristics in association with the implementation may be included in at least one implementation of the disclosure. Therefore, "in some implementation" or "in an implementation" mentioned throughout the specification refers not necessarily to the same implementation. Moreover, those particular features, structures or characteristics may be incorporated in one or more implementations in any suitable manner. It can be understood that, in various implementations of the present disclosure, the ordinal numbers of the various processes above are not intended to indicate that the processes must be performed in any sequential order, and the various processes should be performed in a sequential order determined depending on their functions and inherent logic. Implementing process of implementations of the present disclosure is not limited in this respect. The ordinal numbers in the above-mentioned implementations of the present disclosure are only for the purpose of description and imply no preference for any one or more implementations over the others. Wherever no conflicts occur, the methods disclosed in the several method implementations provided by the present disclosure can be combined arbitrarily to obtain new method implementations.

However, there is much room for improvement of a memory device and a system thereof with the increasing demands for a storage apparatus.

FIG. 1 is a block diagram of an example system 100 having a memory device in accordance with some aspects of the present disclosure. The system 100 may be a mobile phone, a desktop computer, a laptop computer, a tablet computer, a vehicle computer, a game console, a printer, a locating apparatus, a wearable electronic apparatus, a smart sensor, a virtual reality (VR) apparatus, an augmented reality (AR) apparatus or any other suitable electronic apparatus having a memory therein. As shown in FIG. 1, the system 100 may include a host 108 and a memory system 102 that includes one or more memory devices 104 and a memory controller 106. The host 108 can be a processor of an electronic device such as a central processing unit (CPU), or a system-on-chip (SoC) such as an application processor (AP). The host 108 may be configured to send data to the memory device 104 or receive data from the memory device 104.

According to some implementations, the memory controller 106 is coupled to the memory device 104 and the host 108 and is configured to control the memory device 104. The memory controller 106 can manage the data stored in the memory device 104 and communicate with the host 108. In some implementations, the memory controller 106 is designed for operating in a low duty-cycle environment like a secure digital (SD) card, a compact flash (CF) card, a universal serial bus (USB) flash drive, or any other medium for use in an electronic device such as a personal computer, a digital camera, a mobile phone, etc. In some implementations, the memory controller 106 is designed for operating in a high duty-cycle environment like an SSD or an embedded multi-media-card (eMMC), used as a data storage for a mobile device such as a smart phone, a tablet computer or a laptop computer, and an enterprise storage array.

The memory controller 106 can be configured to control operations of the memory device 104, such as read, erase, and programming operations. The memory controller 106 can also be configured to manage various functions with respect to the data stored or to be stored in the memory device 104, including but not limited to bad-block management, garbage collection, logical-to-physical address conversion and wear leveling. In some implementations, the memory controller 106 is further configured to process error correction codes (ECCs) with respect to the data read from or written to the memory device 104. Any other suitable functions can be performed by the memory controller 106 as well, for example, formatting the memory device 104. The memory controller 106 can communicate with an external device (e.g., the host 108) according to a particular communication protocol. For example, the memory controller 106 may communicate with the external device through at least one of various interface protocols, such as a USB protocol, an MMC protocol, a peripheral component interconnection (PCI) protocol, a PCI-Express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
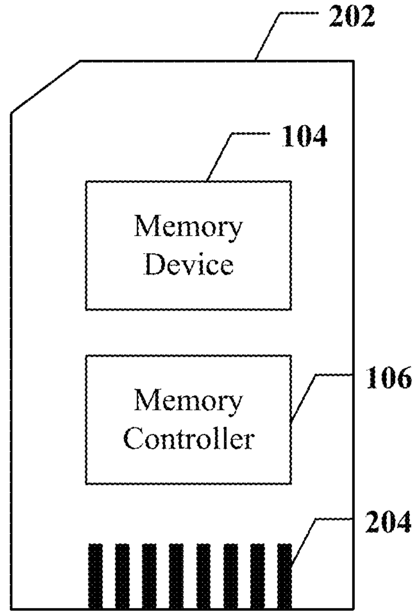
FIG. 2A shows a schematic diagram of a memory card according to an implementation of the disclosure.
Figure 2B:
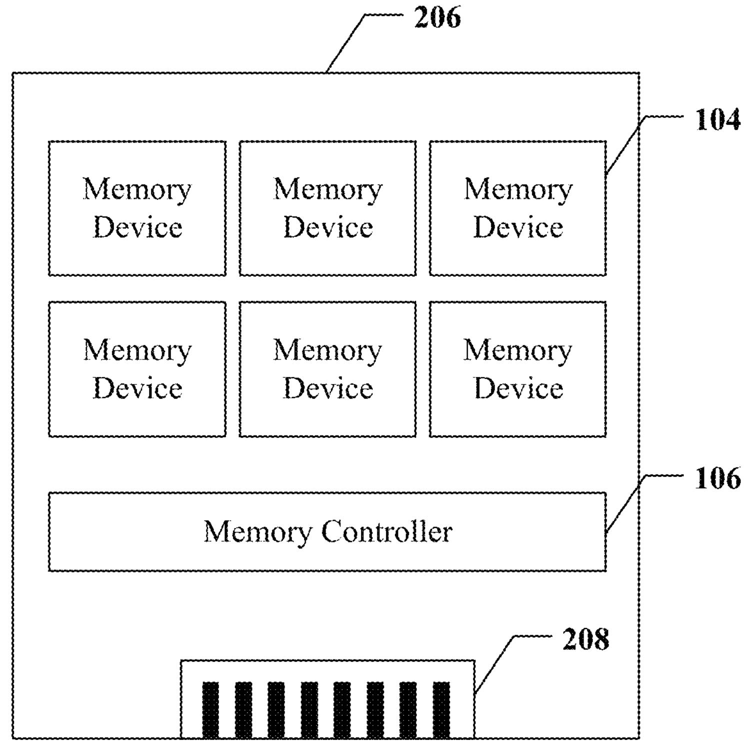
FIG. 2B shows a schematic diagram of an example solid state drive (SSD) according to an implementation of the disclosure.

The memory controller 106 and one or more memory devices 104 can be integrated into various types of storage apparatuses, for example, be included in the same package, such as a universal Flash storage (UFS) package or an eMMC package. That is, the memory system 102 can be implemented and packaged into different types of end electronic products. In one example as shown in FIG. 2A, the memory controller 106 and a single memory device 104 can be integrated into a memory card 202. The memory card 202 may include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. The memory card 202 may further include a memory card connector 204 coupling the memory card 202 with a host, e.g. the host 108 in FIG. 1. In another example as shown in FIG. 2B, the memory controller 106 and a plurality of memory devices 104 may be integrated into an SSD 206. The SSD 206 may also include an SSD connector 208 coupling the SSD 206 with a host (e.g., the host 108 in FIG. 1). In some implementations, at least one of the storage capacity or the operation speed of the SSD 206 is greater than those of the memory card 202.

Figure 3:
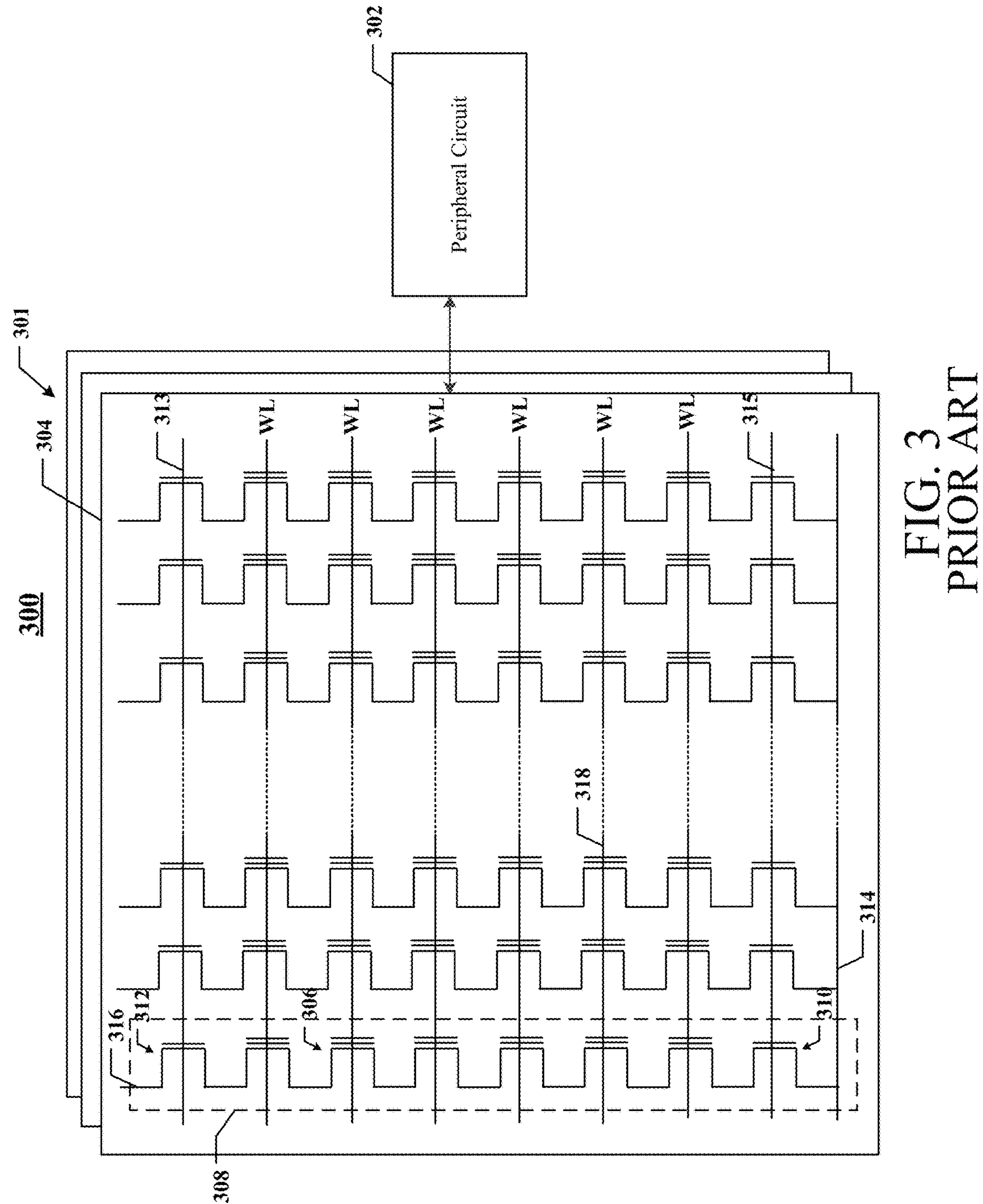
FIG. 3 shows a schematic diagram of an example memory device according to an implementation of the disclosure.

FIG. 3 shows a schematic circuit diagram of an example memory device 300 including a peripheral circuit in accordance with some aspects of the disclosure. The memory device 300 may be an example of the memory device 104 in FIG. 1. The memory device 300 may include a memory cell array 301 and a peripheral circuit 302 coupled to the memory cell array 301. When description is given with a 3D NAND memory cell array taken as an example of the memory cell array 301, memory cells 306 are provided in the form of an array of NAND memory strings 308 each extending vertically above a substrate (not shown). In some implementations, each NAND memory string 308 includes a plurality of memory cells 306 coupled in series and stacked vertically. Each memory cell 306 can retain a continuous analog value, for example, a voltage or charges, depending on the number of electrons trapped in the region of the memory cell 306. Each memory cell 306 may be a memory cell of a floating-gate type that includes a floating-gate transistor, or a memory cell of a charge trapping type that includes a charge trapping transistor.

In some implementations, each memory cell 306 may be a single-level cell (SLC) that has two possible memory states and thus can store one bit of data. For example, the first memory state "0" may correspond to a first voltage range, and the second memory state "1" may correspond to a second voltage range. In some implementations, each memory cell 306 is a multi-level cell (MLC) that is capable of storing more than one single bit of data in more than four memory states. For example, the MLC may store two bits per cell, three bits per cell (also known as a triple-level cell (TLC)), or four bits per cell (also known as a quad-level cell (QLC)). Each MLC may be programmed to assume a range of possible nominal storage values. In an example, if each MLC stores two bits of data, the MLC may be programmed to write one of three possible nominal storage values into the cell, while the fourth nominal storage value other than the three nominal storage values may be used to represent an erased state.

As shown in FIG. 3, each NAND memory string 308 may include a bottom select gate (BSG) 310 at its source end and a top select gate (TSG) 312 at its drain end. The BSG 310 and the TSG 312 may be configured to activate a selected NAND memory string 308 during a read operation and a programming operation. In some implementations, sources of the NAND memory cell strings 308 in the same memory block 304 are coupled together through the same source line (SL) 314 (e.g., a common SL). In other words, in accordance with some implementation, all the NAND memory strings 308 in the same memory block 304 have an array common source (ACS). According to some other implementations, the TSG 312 of each NAND memory string 308 is coupled to a corresponding bit line (BL) 316 and data can be read from or written to the bit line 316 through an output bus (not shown). In some implementations, each NAND memory string 308 is configured to be selected or deselected by applying a select voltage (e.g., a voltage higher than the threshold voltage of the transistor having the TSG 312) or a deselect voltage (e.g., 0V) to the corresponding TSG 312 through one or more TSG lines 313 and/or applying a select voltage (e.g., a voltage higher than the threshold voltage of the transistor having the BSG 310) or a deselect voltage (e.g., 0V) to the corresponding BSG 310 through one or more BSG lines 315.

As shown in FIG. 3, the NAND memory strings 308 can be organized into a plurality of memory blocks 304, each of which may have a common source line 314 (e.g., coupled to the ground). In some implementations, each memory block 304 is a basic data unit used for an erase operation. That is, all the memory cells 306 in the same memory block 304 can be erased simultaneously. In order to erase the memory cells 306 in a selected memory block 304*a*, an erase voltage (Vers), for example, a high positive voltage (e.g., 20V or higher) is bias coupled to the source lines 314 of the selected memory block 304*a* and the unselected memory blocks 304*b* in the same plane as the selected memory block 304*a*. It is understood that, in some examples, an erase operation may be performed at a half-block level, a quarter-block level, or a level having any suitable number of blocks or any suitable fraction of a block. Memory cells 306 of adjacent NAND memory strings 308 can be coupled through word lines 318 that select which row of memory cells 306 is affected by read and programming operations.

Figure 4:
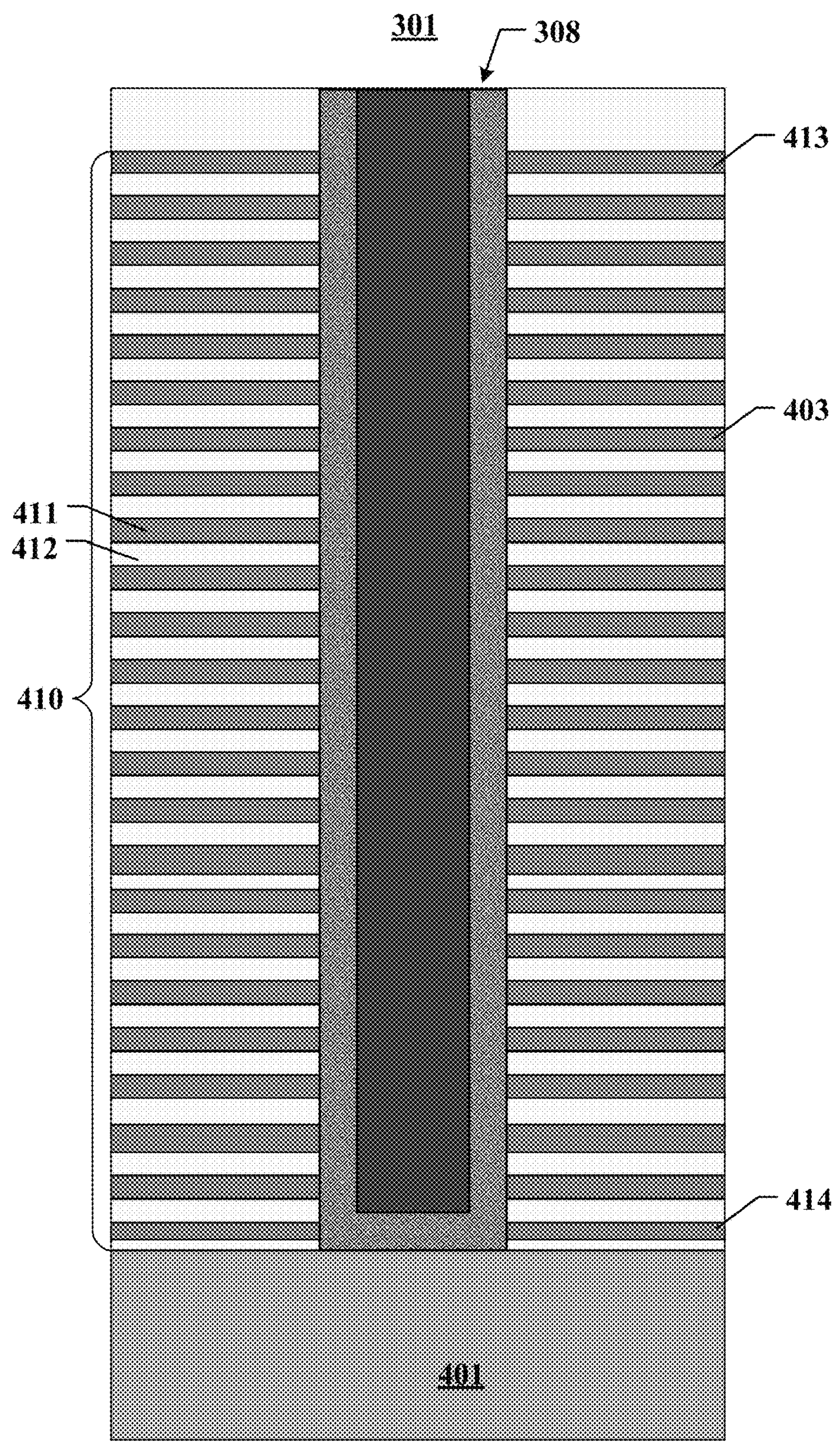
FIG. 4 shows an example cross-sectional diagram of a memory cell array according to an implementation of the disclosure.

FIG. 4 is a cross-sectional diagram of an example memory cell array 301 including NAND memory strings 308 in accordance with some aspects of the present disclosure. As shown in FIG. 4, the NAND memory strings 308 may include a stack structure 410 including a plurality of gate layers 411 and a plurality of insulating layers 412 stacked alternately. The NAND memory strings 308 extend vertically through the gate layers 411 and the insulating layers 412. The gate layers 411 and the insulating layers 412 may be stacked alternately and every two adjacent gate layers 411 are isolated from each other by an insulating layer 412. The number of memory cells included in the memory cell array 301 may be determined by the number of pairs of gate layers 411 and insulating layers 412 in the stack structure 410.

The material of the gate layers 411 may include a conductive material. The conductive material includes, but not limited to, tungsten (W), cobalt (Co), copper (Cu), aluminum (Al), polysilicon, doped silicon, silicide or any combination thereof. In some implementations, each gate layer 411 includes a metal layer, for example, a tungsten layer. In some implementations, each gate layer 411 includes a doped polysilicon layer. Each gate layer 411 may include control gates surrounding memory cells. The gate layer 411 on the top of the stack structure 410 may extend laterally as an upper select gate line and the gate layer 411 at the bottom of the stack structure 410 may extend laterally as a lower select gate line. Those gate layers 411 extend laterally between the upper select gate line and the lower select gate line may serve as word line layers.

In some implementations, the stack structure 410 may be disposed on a substrate 401. The substrate 401 may include silicon (e.g. single crystal silicon), silicon germanium (SiGe), gallium arsenide (GaAs), germanium (Ge), silicon on insulator (SOI), germanium on insulator (GOI) or any other suitable material.

In some implementations, a NAND memory string 308 includes a channel structure extending through the stack structure 410 vertically. In some implementations, the channel structure includes a channel hole filled with one or more semiconductor materials (e.g., as a semiconductor channel) and one or more dielectric materials (e.g., as a memory film). In some implementations, the semiconductor channel includes silicon, for example, polysilicon. In some implementations, the memory film is a composite dielectric layer including a tunneling layer, a storage layer (also referred to as a "charge trapping/storage layer") and a blocking layer. The channel structure may have a cylindrical shape (e.g., a pillar shape). In accordance with some implementations, the semiconductor channel, the tunneling layer, the storage layer and the blocking layer are arranged radially from the center to the outer surface of the pillar in this order. The tunneling layer may include silicon oxide, silicon oxynitride or any combination thereof. The storage layer may include silicon nitride, silicon oxynitride or any combination thereof. The blocking layer may include silicon oxide, silicon oxynitride, a high dielectric constant (high-k) dielectric or any combination thereof. In one example, the memory film may include a composite layer of silicon oxide/silicon oxynitride/silicon oxide (ONO).

Figure 5:
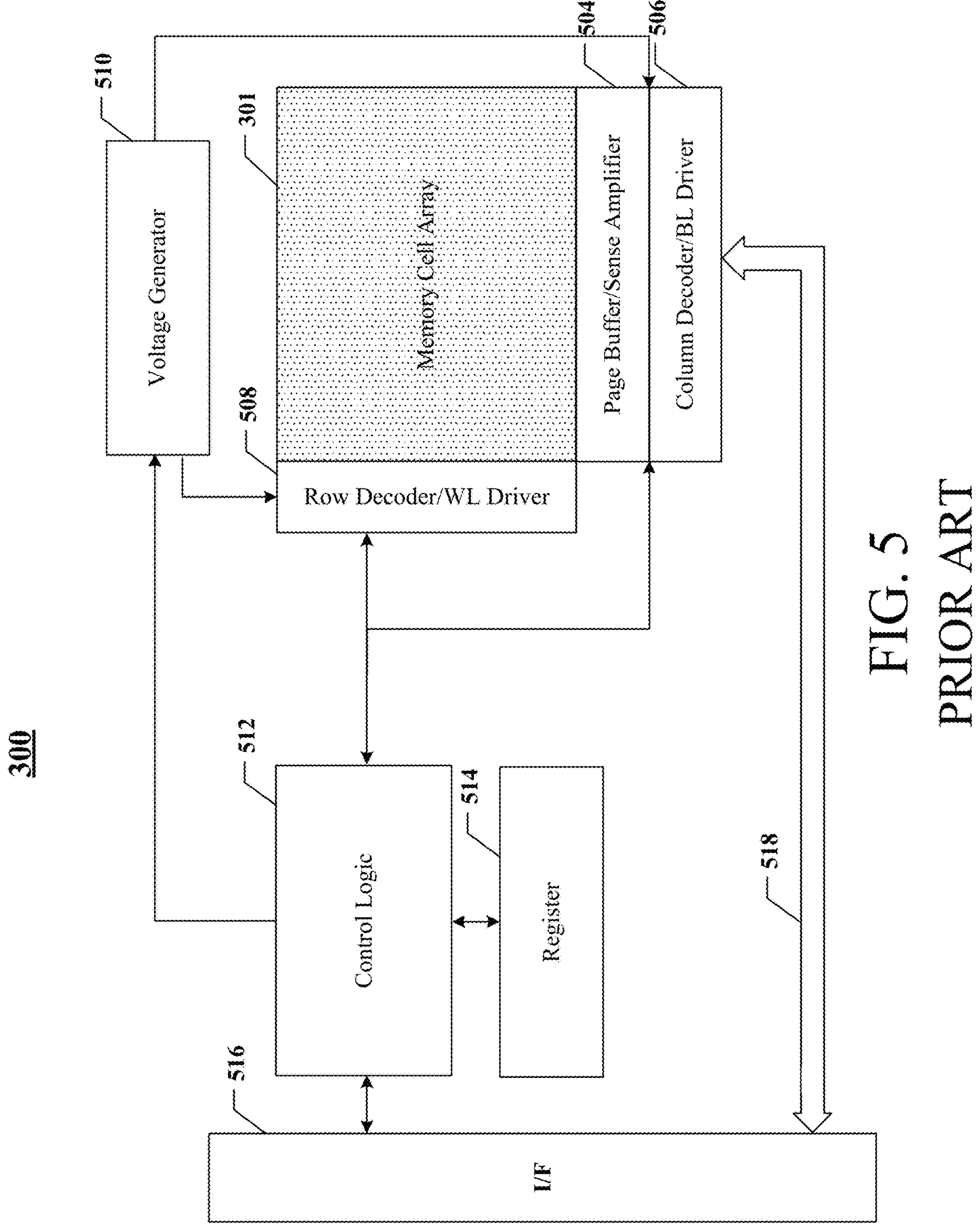
FIG. 5 shows a schematic diagram of another example memory device according to an implementation of the disclosure.

With reference to FIG. 3 again, the peripheral circuit 302 may be coupled to the memory cell array 301 through bit lines 316, world lines 318, source lines 314, BSG lines 315 and TSG lines 313. The peripheral circuit 302 may include any suitable analog, digital, and mixed-signal circuits to facilitate operations of the memory cell array 301 by applying at least one of voltage signals or current signals to and at least one of sensing signals or current signals from each target memory cell 306 through bit lines 316, word lines 318, source lines 314, BSG lines 315 and TSG lines 313. The peripheral circuit 302 may include various types of peripheral circuits formed using the metal-oxide-semiconductor (MOS) technology. For example, FIG. 5 illustrates some example peripheral circuits and the peripheral circuit 302 include a page buffer/sense amplifier 504, a column decoder/bit line driver 506, a row decoder/word line driver 508, a voltage generator 510, a control logic 512, a register 514, an interface 516, and a data bus 518. It should be understood that, in some examples, additional peripheral circuits not shown in FIG. 5 may be further included.

The page buffer/sense amplifier 504 may be configured to read data from the memory cell array 301 and program (write) data to the memory cell array 301 according to control signals from the control logic 512. In one example, the page buffer/sense amplifier 504 may store programming data (writing data) to be programmed into the memory cell array 301. In another example, the page buffer/sense amplifier 504 may perform program verification operations to ensure that the data have been properly programmed into the memory cells 306 coupled to the selected word lines 318. In still another example, the page buffer/sense amplifier 504 may also sense low power signals from the bit line 316 that represent data bits stored in the memory cells 306 and amplify the small voltage swings to recognizable logic levels in a read operation. The column decoder/bit line driver 506 can be configured to be controlled by the control logic 512 and select one or more NAND memory strings 308 by applying bit line voltages generated from voltage generator 510.

The row decoder/word line driver 508 can be configured to be controlled by the control logic 512 and select/deselect memory blocks 304 of the memory cell array 301 and select/deselect word lines 318 of a memory block 304. The row decoder/word line driver 508 can be further configured to drive word lines 318 using word line voltages generated from the voltage generator 510. In some implementations, the row decoder/word line driver 508 can also select/deselect and drive the BSG lines 315 and the TSG lines 313. As described below in detail, the row decoder/word line driver 508 is configured to perform programming operations on the memory cells 306 coupled to one or more selected word lines 318. The voltage generator 510 can be configured to be controlled by the control logic 512 and generate the word line voltages (e.g., a read voltage, a programming voltage, a pass voltage, a channel boost voltage, a verification voltage, etc.), bit line voltages, and source line voltages to be supplied to memory cell array 301.

The control logic 512 may be coupled to each peripheral circuit described above and configured to control operations of each peripheral circuit. The register 514 may be coupled to the control logic 512 and include a status register, a command register and an address register for storing status information, command operation codes (OP codes) and command addresses for controlling operations of each peripheral circuit. The interface 516 may be coupled to the control logic 512 and serve as a control buffer to buffer control commands received from the host (not shown) and relay them to the control logic 512, and buffer status information received from the control logic 512 and relay them to the host. The interface 516 may be further coupled to the column decoder/bit line driver 506 through the data bus 518 and serve as a data I/O interface and a data buffer to buffer data and relay it to the memory cell array 301 or relay or buffer data from the memory cell array 301.

In some implementations, memory cells of a NAND memory may be classified as single-level memory cells (one-bit memory cells), double-level memory cells (two-bit memory cells), tri-level memory cells (three-bit memory cells), quad-level memory cells (four-bit memory cells) and penta-level memory cells (five-bit memory cells) according to their storage density. Nevertheless, a page can be taken as the unit for programming and read operations no matter the memory cells are single-level or multi-level ones. The memory cells may be M-bit memory cells and have 2M data states including the erased state and programmed states other than the erased state. For a programming operation, a memory cell in the erased state may be programmed into a target state by a programming voltage increased stepwise. If the target state is the erased state, the memory cell may not be programmed. For a read operation, M-bit data can be read through 2M−1 levels of read voltages. Illustratively, for example, a first-level read voltage is between the threshold voltages of the erased state and the first programmed state, and when applied to a word line, a memory cell in the erased memory cell is turned on and a memory cell in the first programmed state is not turned on, so that the erased state and the first programmed state are distinguished from each other and read out.

In some examples, the memory controller receives a programming request from the host and sends a programming command accompanied with (or along with) address information to the memory device. The memory device receives the command, decodes the address information, programs the corresponding one or more memory cells, and may also update and feed the physical address-logical address after the programming back to the memory controller. When a memory cell is programmed, a selected word line is applied with a programming voltage and then a verification voltage is applied to the selected word line to verify whether the threshold voltage of the programmed memory cell conforms to the threshold voltage of the preset programmed state and thus determine whether the programming has succeeded. When a programming operation is performed on a selected word line, one or more memory cells on the selected word line may be programmed. In some examples, a flow of programming operations may include a verification operation, i.e., the memory controller sends a programming command to the memory device and then the memory device performs a programming operation and a verification operation without any command sent separately for the verification operation.

Figure 6:
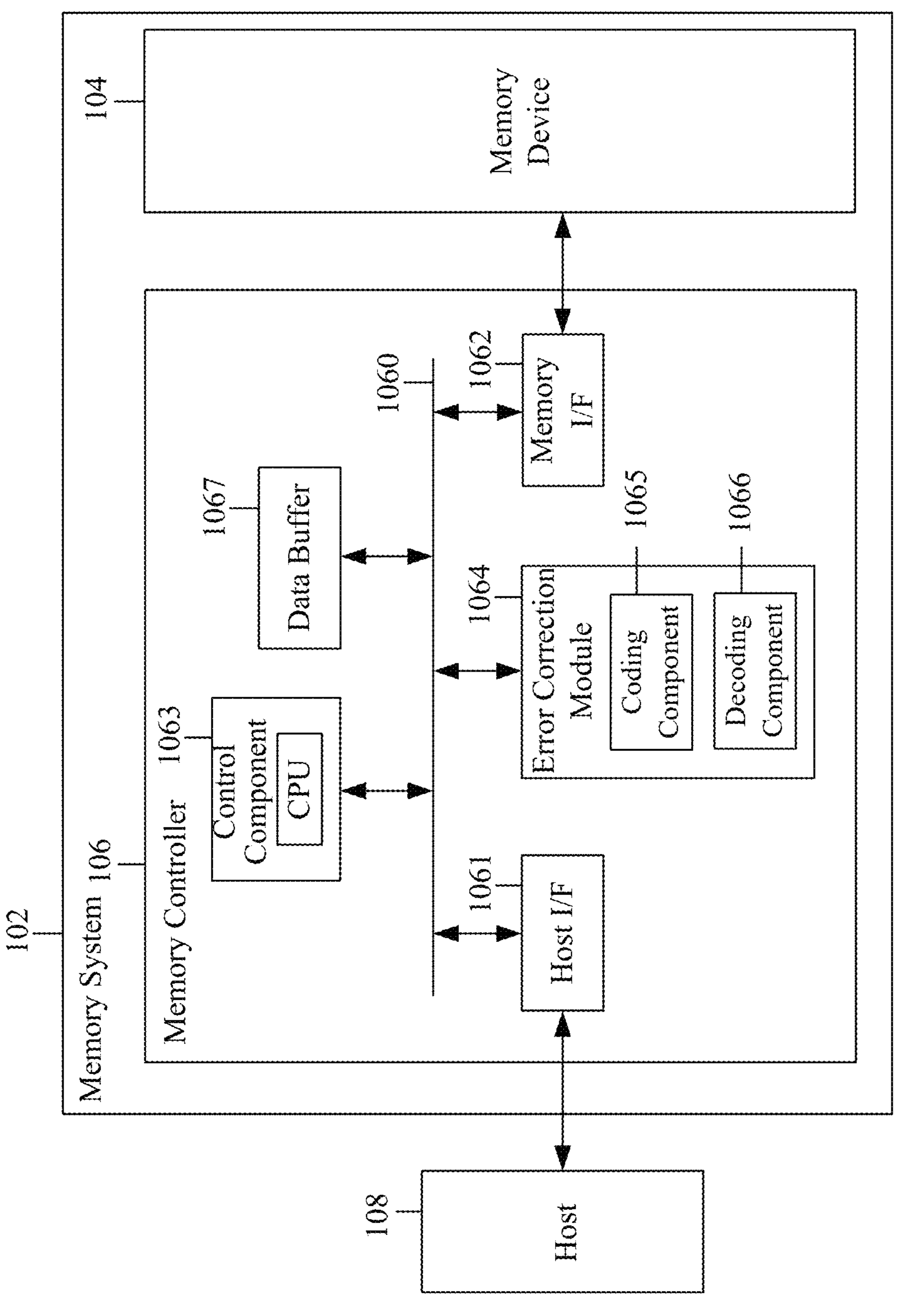
FIG. 6 shows a schematic diagram of a memory system according to an implementation of the disclosure.

FIG. 6 provides a block diagram illustrating a memory controller 106 applied to a memory system 102. As shown in FIG. 6, the memory system 102 includes a memory controller 106 and a memory device 104 with the memory controller 106 being coupled to the memory device 104 in any suitable way. In an implementation of the present disclosure, the memory controller 106 includes a host I/F 1061, a memory I/F 1062, a control component 1063, an error correction code (ECC) module 1064, a data buffer 1067 and an internal bus 1060 with the ECC module 1064 including a coding component 1065 and a decoding component 1066. The host I/F 1061 outputs the commands, user data (write data) and the like received from the host 108 to the internal bus 1060 and sends the user data (read data) read from the memory device 104, a response from the control component 1063 and the like to the host 108.

For user data or the like, the memory I/F controls the processing of writing to and reading from the memory device 104 based on the instructions from the control component 1063. The control component 1063 controls the memory system 102 globally and may be a central processor (CPU), a microprocessor (MPU) or the like. When receiving commands from the host 108 through the host I/F 1061, the control component 1063 performs control according to the commands. For example, the control component 1063 directs the memory I/F 1062 to write user data and parity into the memory device 104 according to the commands from the host 108. Furthermore, the control component 1063 instructs the memory device 104 through the memory I/F 1062 to program the memory cells according to the commands from the host 108, and the memory device 104 updates the physical address-logical address table after the programming operation and feeds the table back to the data buffer 1067 for storage through the memory I/F 1062. Or the control component 1063 instructs the memory device 104 through to read user data and parity from the memory device 104 according to the commands from the host 108.

The ECC module 1064 has a coding component 1065 and a decoding component 1066. The coding component 1065 can encode user data of a predetermined size to be written in the same page so as to generate parity data. Encoding may be performed based on the programmed data to generate the parity data. The parity data are written into the page where the user data have been written as the basis of programming and the decoding component 1066 uses the parity data for decoding. The data buffer 1067 saves temporarily the user data received from the host 108 before storing of the data into the memory device 104 and saves temporarily the data read from the memory device 104 before sending of the data to the host 108.

Figure 7:
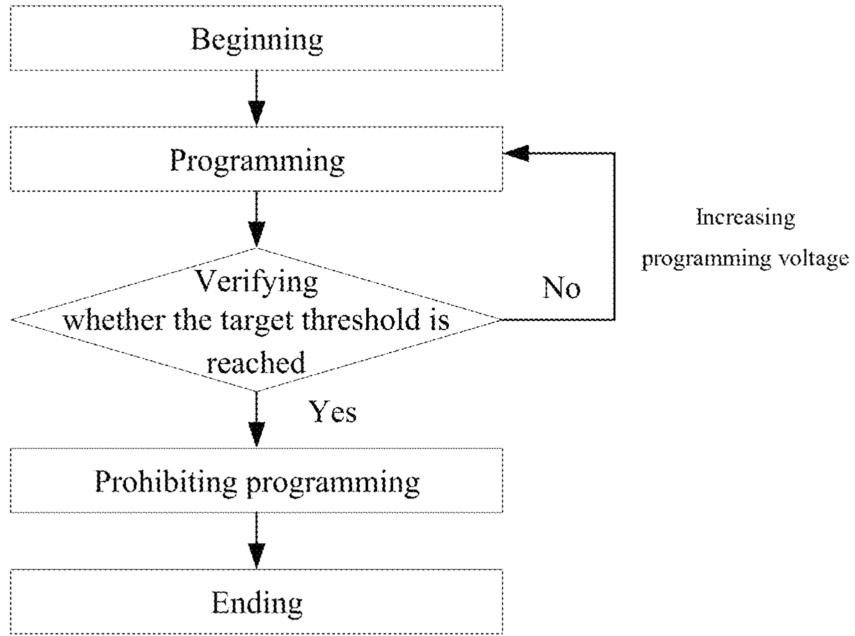
FIG. 7 shows a flow chart of an example programming operation according to an implementation of the disclosure.

In some example implementations, FIG. 7 shows a flow chart of an increment step pulse programming (ISPP) method. With a memory cells on one word line being taken as an example, the memory block where the memory cell is located is erased to put the memory cell into an erased state, the memory block including a plurality of word lines; when the programming begins, an initial programming voltage is first applied to the word line coupled with the memory cell to program the memory cell and then a verification voltage is applied to the word line to verify whether the memory cell has been programmed to a target threshold; if the target threshold is not reached, a relatively higher programming voltage is used to program the memory cell and then the further programmed memory cell is verified; and the above-described programming and verification processes are repeated until the target threshold of the memory cell is determined to have been reached during a verification process and thus the memory cell is programmed to the target state. When the target state of the memory cell is the erased state, a programming inhibiting voltage is applied to bit line of the memory cell to inhibit programming of the memory cell and keep the memory cell in the erased state. When the memory cell is programmed to the target programmed state, during subsequent program processes of other memory cells, the bit line of the memory cell is applied with a programming inhibiting voltage to prohibit the memory cell from being programmed again. The ISPP programming may use a programming voltage, that increases stepwise, to program, so that the risk of triggering an erase operation to program again due to over programming caused by a too high programming voltage applied at one time can be reduced, facilitating improvement of programming efficiency.

Figure 8:
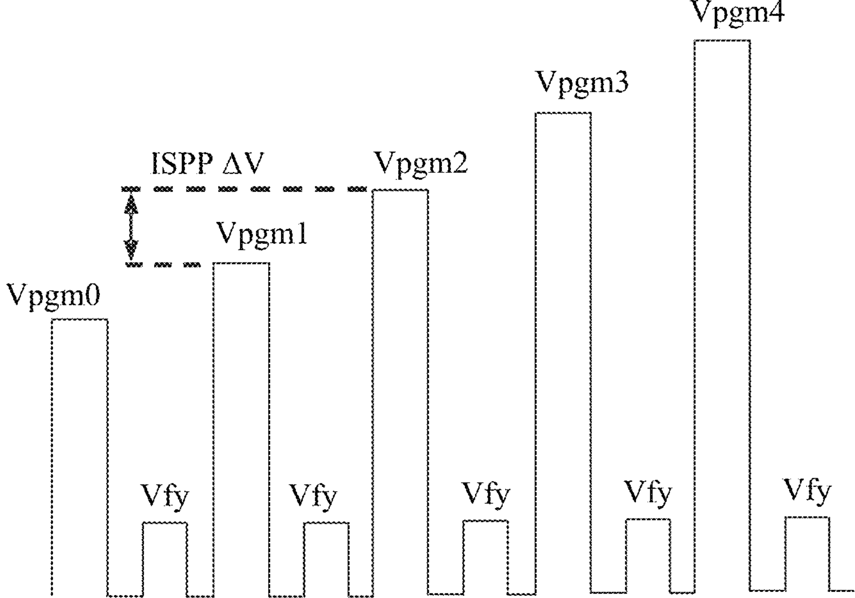
FIG. 8 shows a schematic diagram illustrating programming voltages and verification voltages according to an implementation of the disclosure.

In some example implementations, FIG. 8 shows a schematic diagram illustrating programming and verification voltages of an ISPP method. In FIG. 8, Vpgm0 may be an initial programming voltage for a programming operation and applied to a selected word line. Then a verification voltage Vfy is applied to the selected word line to verify the threshold voltage of the programmed memory cell and when the verification fails the programming voltage is increased to Vpgm1 to perform next programming operation. FIG. 8 shows Vpgm1 to Vpgm4 that are programming voltages increased successively due to multiple times of verification failure and the programming voltage will not be increased when the verification succeeds. Vpgm1 to Vpgm4 may be multiple examples of programming voltage for a flow of programming operations, and the ISPP step increased every time may be ΔV. That is say, the increment in voltage between two adjacent programming voltages, i.e. the difference between two adjacent programming voltages is ΔV. For example, the difference between Vpgm1 and Vpgm2 as shown in FIG. 8 is ΔV and Vpgm2 and Vpgm3 may also have a voltage difference ΔV therebetween.

In some implementations, the voltage difference ΔV may be in a range of 0.05V-0.6V, for example, 0.4V or 0.5V, and may be set according to various operating conditions during an ex-factory test as well as test and optimization of user design of the memory device 104 and be stored in a certain module of the memory device 104; and when the memory device 104 is powered on, parameter data including the voltage difference ΔV, the verification voltage Vfy and any other parameters related to the programming, read and erase operations are read out and buffered into a register of the control logic or any other register of the peripheral circuit 302 so as to be accessed by the control logic, and related operations, including but not limited to a programming operation, a read operation and an erase operation, can be performed on the memory cell array according to the parameter data. It is to be noted that Vpgm1 to Vpgm 4 shown in FIG. 8 are only examples and there may be more times of voltage increasing if verification fails. There is no limitation in this respect.

In some implementations, for a memory cell having a target state that is non-erased state, for example, a first memory cell, a programming voltage is applied to the first memory cell and then a verification operation (e.g., the second verification operation mentioned below) is performed on the first memory cell; after application of the verification voltage, the peripheral circuit 302 of the memory device 104 counts the number of the first memory cells having a threshold voltage lower than the verification voltage and compares the number with a set threshold; if the number of the programmed first memory cells each having a threshold voltage lower than the verification voltage is lower than the set threshold, it indicates that the programming succeeds; and if the number is higher than the set threshold, it indicates that the programming fails and the value of the programming voltage is further increased to continue the programming.

Figure 9:
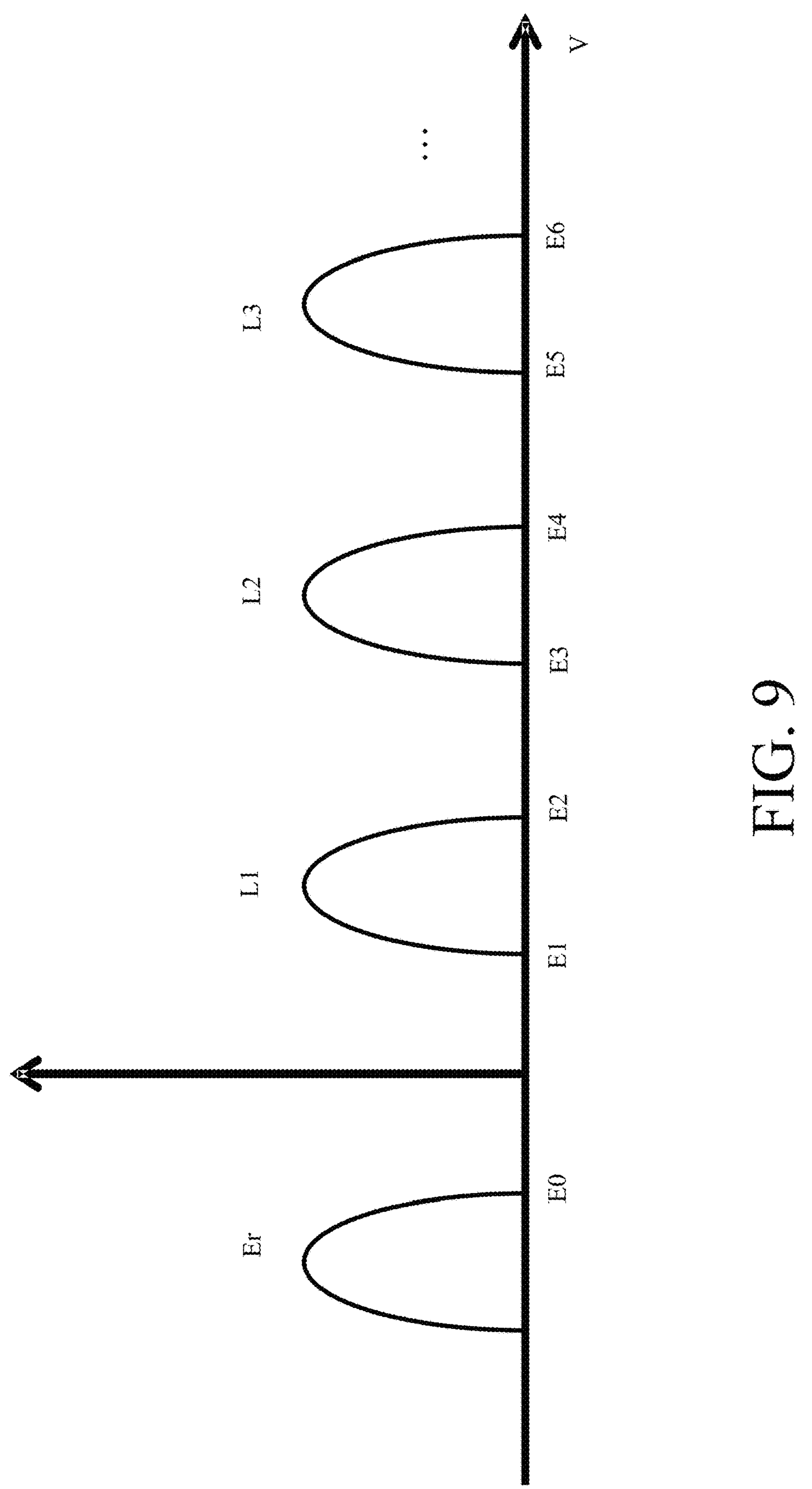
FIG. 9 shows a schematic diagram illustrating threshold voltages of a memory cell with different target states according to an implementation of the disclosure.

In some implementations, as shown in FIG. 9, only the threshold voltage distribution of the erased state Er and programmed states L1, L2 and L3 are illustrated as an example and there are more programmed states not shown. For the threshold voltage distribution of a programmed state, the verification voltage of the programmed state may be the minimal value of the threshold voltage distribution. For example, the verification voltage of the L1 state may be E1, the verification voltage of the L2 state may be E3 and the verification voltage of the L3 state may be E5.

In some implementations, the memory device 104 may include open memory blocks and closed memory blocks. Open memory blocks are those not fully written and closed memory blocks are those fully written. When data transferring, wear leveling and garbage collection are not being done, erase and programming operations will not be performed on the closed memory blocks and only read operations can be performed on them, while access, read and programming operations can be performed on the open memory blocks. When a read operation is performed on a memory cell of an open memory block, according to a read command from the memory controller 106 and corresponding address information, the memory device 104 applies a read voltage Vread to the word line corresponding to the memory cell to be read and applies a pass voltage Vpass to the memory cells not to be read with the pass voltage Vpass being generally higher than the read voltage Vread. For a memory cell having a relatively high number of possible programmed states, a plurality of read voltages may be needed to determine its threshold voltage. When some memory cells of an open memory block are read a relatively high number of times, the world lines of some memory cells in the erased state are applied with the pass voltage a relatively high number of times, the electrons in the channels of the memory cells may enter the corresponding storage layers (also referred to as "charge trapping/storage layers") under the pass voltage and cause the memory cells that should be in the erased state to be programmed to some degree and the threshold voltages of the memory cells to shift to the direction of increasing, resulting in interference to subsequent programming and read operations. The interference caused by the shift of threshold voltage because of too many read operations may be defined as read interference in implementations of the present disclosure.

Figure 10:
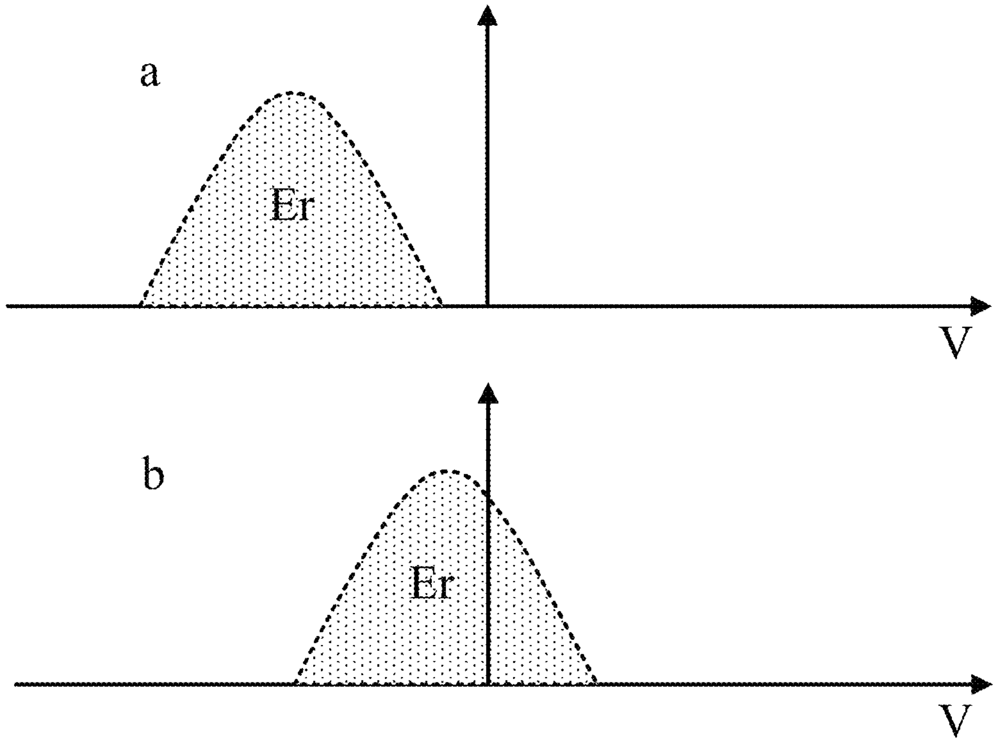
FIG. 10 shows a schematic diagram illustrating a threshold voltage of a memory cell with an erase state according to an implementation of the disclosure.

As illustrated in FIG. 10, the curve shows the threshold voltage distribution of a memory cell in the erased state (Er) without shift of threshold voltage and is located on the left side of the vertical axis; and the curve b shows the shift of the threshold voltage towards the direction of increasing (towards right) due to the read interference. Some memory cells may have a threshold voltage exceeding the vertical axis. When the memory cells having shifts of threshold voltage due to the read interference are programmed subsequently, the bit lines of the memory cells having the erased state as the target state will be inhibited from being programmed and the threshold voltages of the memory cells will have shifts as shown by the curve b, interfering programming and read operations of data possibly.

Figure 11:
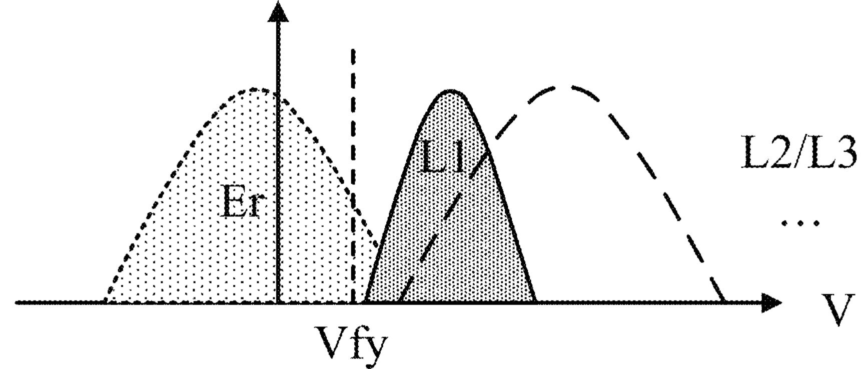
FIGS. 11 and 12 show schematic diagrams illustrating the threshold voltage of a memory cell in the erased state that is higher than a verification voltage according to an implementation of the disclosure.
Figure 12:
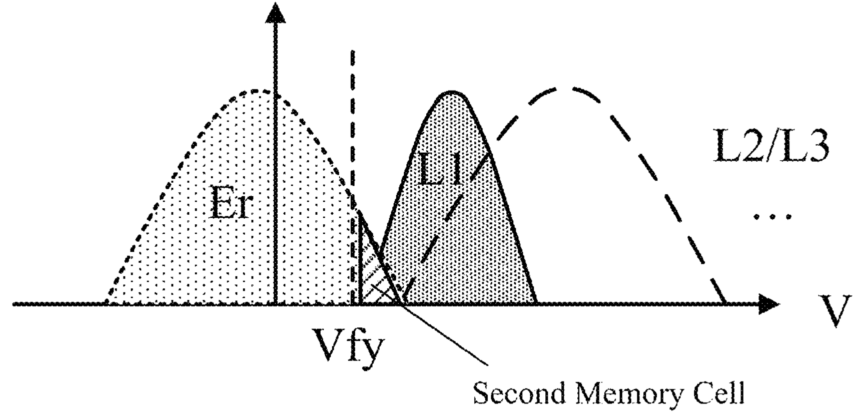

In some implementations, as shown in FIG. 11, when a programmed first memory cell having the L1 state as the target state is verified, there may be such a situation that some memory cells having the erased state as the target state have a threshold voltage larger than the verification voltage Vfy of the L1 state due to the shift caused by the read interference; however, in a common verification process, only the number of the memory cells that are to be programmed into the L1 state and with a threshold voltage smaller than the verification voltage is counted and the threshold voltages of the memory cells with the erased state as the target state will not be compared with the verification voltage. FIG. 12 shows a second memory cell having the erased state as the target state and having a threshold voltage larger than the verification voltage. Existence of such second memory cells may interfere data programming and subsequent data reading to make the second memory cells be determined to be in the L1 state and thus cause read errors, which may need an ECC correction operation. When the read interference is serious and results in a relatively high number of the second memory cells, the ECC correction may fail and the operating efficiency of the memory device 104 is lowered. In view of this, some aspects of implementations of the present disclosure provide a memory device 104 and a memory system 102, in which extent of the read interference to an open memory block can be characterized by the count of the number of the second memory cells and in turn indicates whether a programming operation will fail because of too high a read interference in time, so that the programming operation can quit in time and other operations can be performed to deal with the program failure, improving the operating efficiency of the memory device 104.

In some aspects of implementations of the present disclosure, as shown in connection with FIGS. 1 and 3, a memory device 104 is provided, the memory device including: a memory block including a plurality of memory cells; a plurality of word lines coupled to the memory block; and a peripheral circuit 302 coupled to the plurality of word lines and configured to: perform a first programming operation in response to a first operation command to program first memory cells coupled to a first word line in the memory block; perform a first verification operation to obtain the first number of second memory cells in the memory block that are coupled to the first word line, the second memory cells being those coupled to the first word line, having an erased state as the target state and a threshold voltage larger than a first verification voltage, which is a verification voltage of the first programmed state; and generate a first state identifier indicating programming failure in response to the first number being larger than a first threshold. In some implementations, the memory block may include an open memory block.

In some implementations, for the memory cells on the same word line in an open memory block, for example, for first memory cells on a first word line in an open memory block, the first memory cells after being programmed have the non-erased state as the target state; and the second memory cells are those with a threshold voltage larger than the first verification voltage, of the memory cells with the erased state as the target state. The first verification voltage is the verification voltage corresponding to the first programmed state. For example, as shown in FIG. 9, the verification voltage of the L1 state may be E1, the verification voltage of the L2 state may be E3, the verification voltage of the L3 state may be E5, and the verification voltage of the first programmed state may be E1, E3 or E5. A threshold voltage of a second memory cell may be as illustrated in FIG. 12. The first verification voltage is Vfy, the target state of a first memory cell after the first programming operation is the L1 state, and the first verification voltage Vfy is the verification voltage E1. Implementations of the present disclosure are not limited in the number of word lines and the number of memory cells on the same word line.

Before the programming operation, the target states of programming, positions and numbers of different memory cells are definite, and the memory controller 106 may implement distribution according to a request from the host 108 and the remaining capacity of the current memory device 104 and send address information to the memory device 104. When the physical quantity of the memory cells on the same word line is a definite value, the peripheral circuit 302 programs memory cells of different addresses into their target states according to the first operation command from the memory controller 106 and a program forbidding voltage is applied to the bit lines of the memory cells each having the erased state as the target state to prohibit the memory cells from being programmed. In an implementation of the present disclosure, the first operation command is a programming operation command including address information; or the address information may be accompanied with the first operation command to be sent to the memory device 104. The first operation command may direct the memory device 104 to perform the first programming operation and the first verification operation.

In some implementations, when programming the memory cells on the same word line according to data from the host, the memory controller 106 may perform processing of random distribution on the target states of the plurality of memory cells on the same word line. The number of the plurality of memory cells on the same word line is N, each memory cell is an M-bit memory cell and includes 2M target states including the erased state, the number of the memory cells included in each target state may be N/2M and may be equal or approximately equal within certain limits. The number N of the plurality of memory cells in this implementation may be the number of all the memory cells on the same word line, or N may also be the number of the memory cells in a region of the same word line. Here, the word line may correspond to a plurality of memory regions, in which programming and read operations can be performed separately. Each memory region includes a plurality of memory cells.

In some implementations, as shown in FIG. 12, after the first programming operation is performed on the memory cells on the first word line, a first verification voltage is applied to the memory cells each having the erased state as the target state to perform the first verification operation and may also be applied to the first memory cells having a non-erased state as the target state at the same time; the peripheral circuit 302 counts the first number of the second memory cells, each of which has the erased state as the target state and has a threshold voltage larger than the first verification voltage, and compare the first number with a set first threshold; and when the first number is larger than the first threshold, it can be considered that the threshold voltages of the memory cells in the erased state shift too much due to the read interference and the peripheral circuit 302 generates a first state information indicating failure of programming. The first threshold may be a set value obtained by performing various performance and parameter tests on the memory device 104 during the ex-factory testing phase of memory device 104 and the memory system 102 and may be written into a memory region of the memory device 104, so that when the memory device 104 is powered on, the data can be loaded into a related register for calling by a control logic. Illustratively, the first threshold may be determined according to the number of the memory cells with the erased state as the target state, for example, may be 0~10% of the number.

The first state information may be stored in a register of the peripheral circuit 302, and be sent by the memory device 104 to the memory controller 106 or obtained actively by the memory controller 106. In response to failure of programming, the memory device 104 will quit the programming operation flow, stop performing the subsequent verification operation and increase the programming voltage to continue the programming operation on the first memory cells. At this time, the memory device 104 may enter an execution flow to cope with failure of a programming operation in response to the failure. This execution flow may be performed after a corresponding operation command is received from the memory controller 106 or the memory device 104 may enter the execution flow in case of failure of a programming operation when the first state identifier indicating failure of programming is generated. The execution flow may include: terminating the programming operation on the first memory cells; feeding the physical addresses of the first memory cells that fail to be programmed back to the memory controller 106 or obtaining by the memory controller 106 the physical addresses of the first memory cells that fail to be programmed according the first state identifier; adjusting the physical addresses for reprogramming; and directing the peripheral circuit 302 of the memory device 104 to skip the programming on the memory cells on the first word line and program the memory cells on other word lines, or to skip the memory regions on the first word line, which include the first memory cells and the second memory cells and are configured to express the host data written into the memory device 104 by the current programming operation, and perform a programming operation on other memory regions on the first word line to write the host data having undergone failure of programming into other memory cells.

In some implementations, after the first verification operation is performed, if the number of the second memory cells is smaller than or equal to the first threshold, the first verification operation succeeds, which means that the extent of the shifts of the threshold voltages of the memory cells with the erased state as the target state exerts a relatively low interference on data programming and reading or in other words will not cause errors in data programming or failure of reading. However, at this point the first memory cells with a non-erased state as the target state are not verified with respect to the threshold voltages and need to be verified to determine whether their threshold voltages meet the target states after the first programming operation. Different from the first verification operation, a second verification operation will be performed on the first memory cells and may use a second verification voltage. The first verification voltage and the second verification voltage in the implementation of the present disclosure are only used to distinguish verification operations for different phases and not limited in voltage value. They may be equal or not equal to each other.

In an implementation of the present disclosure, the first verification operation is performed after the first programming operation, and when it is determined that the first number of the second memory cells, each of which has the erased state as the target state and a threshold voltage smaller than the first verification voltage, is smaller than the first threshold, the interference to the programming operation caused by the shifts of threshold voltages of the memory cells because of factors such as the read interference is relatively low or substantially exerts no influence and after the first verification operation succeeds the second verification operation is performed on the programmed first memory cells to determine whether they have achieved the target state; and when the first verification operation fails, namely indicating that the programming fails, the second verification operation will not be performed and no subsequent programming will be further performed on the first memory cells, so that the operating efficiency of the memory device 104 is improved.

In some implementations, the peripheral circuit 302 is further configured to: in response to the first number being smaller than or equal to the first threshold, perform the second verification operation to obtain the second number of the first memory cells with a threshold voltage smaller than the first verification voltage; and in response to the second number being smaller than a second threshold and the first programmed state being the highest state, generate a second state identifier to indicate that the programming succeeds.

In some implementations, the peripheral circuit 302 is further configured to: in response to the first programmed state not being the highest state, continue the programming using the ISPP programming method. In response to the second number being smaller than the second threshold and the first programmed state having not reached the highest state, the voltage value of the programming voltage is increased to continue the programming on the first memory cells and the voltage value of the verification voltage for the second verification operation is increased to continue the verification on the first memory cells until the second number is smaller than the second threshold and the first memory cells reach the highest programmed state.

In some implementations, the peripheral circuit 302 is further configured to: in response to the second number being larger than or equal to the second threshold, increase the voltage value of the programming voltage to continue the programming on the first memory cells until the second number is smaller than the second threshold and the first memory cells reach the highest programmed state; and generate the second state identifier.

After application of programming voltages to the first memory cells is completed, a second verification operation is performed on the first memory cells using a verification voltage. The first memory cells of different target states have different verification voltages (e.g. the second verification voltages). For example, as shown in FIG. 9, the second verification voltage of the L1 state may be E1, the second verification voltage of the L2 state may be E3 and the second verification voltage of the L3 state may be E5. After the second verification voltage is applied to the word line of the first memory cells, the number of the first memory cells with a threshold voltage smaller than the second verification voltage is counted and named as the second number. The second number being smaller than the second threshold means that more first memory cells have been programmed into their target states and the host data may be programmed and stored. The second number being larger than or equal to the second threshold means that the number of the memory cells having reached their target states now is not sufficient to program and store the host data. The second threshold may be determined according to the number of the first memory cells, for example, 0~10% of the number. The second threshold may be written into a certain memory region of the memory device 104 during the ex-factory test, so that when the memory device 104 is powered on, the data can be loaded into a related register for calling by a control logic.

In some implementations, as shown in FIG. 12, the verification voltages of the first verification operation and the second verification operation may be equal to each other and may both be a verification voltage for the second verification operation of target states and be named as the first verification voltage Vfy. When the verification voltages of the two verification operations are equal to each other, the first verification voltage may be applied simultaneously to the memory cells each having the erased state as the target state and the memory cells each having the non-erased state as the target state. Next, it is determined whether the first number is greater than the first threshold and, if not, it is determined whether the second number is smaller than the second threshold. In some examples, when the first memory cells have the L1 state as the target state, the first verification voltage Vfy may be E1 and the first number of the second memory cells each having the erased state as the target state and a threshold voltage larger than E1 is determined by the first verification operation. When the first number is smaller than or equal to the first threshold, the first verification operation succeeds. The verification voltage E1 is used to perform the second verification operation on the programmed first memory cells. When the second number of the first memory cells with a threshold voltage smaller than the verification voltage E1 is smaller than the second threshold, the second verification operation succeeds and a second state identifier is generated to indicate success of programming. Furthermore, an updated physical address to logical address mapping table may be fed back to the memory controller 106. When the second number is larger than or equal to the second threshold, the second verification operation fails and at this time the programming voltage needs to be increased to continue the programming on the first memory cells until the second number is smaller than the second threshold. The increment step of voltage may be ΔV as illustrated in FIG. 8. In FIG. 12, the second number of the first memory cells is larger than the second threshold, the first programming operation on the first memory cells has not been completed and the number of the first memory cells with a threshold voltage larger than the first verification voltage Vfy has not reached the value indicating success of programming. The threshold voltage distribution of the first memory cells having been programmed into the L1 state successfully is shown as the dashed peak on the right side of peak of the L1 threshold voltage distribution in the figure, where there are more first memory cells.

In some implementations, when a high programmed state with a high verification voltage is being programmed, the memory cells may be first programmed into a low target state with a low verification voltage, and after application of one or more programming voltages, different verification voltages are used to perform the second verification operation on the memory cells to determine whether they have reached the individual target states. With QLC memory cells taken as an example, a memory cell includes 16 target states including the erased state, and the memory cells that are on the same word line and have the 15 programmed states (L1 to L15) as their target states are programmed. If the L1 to L15 states are all fully programmed, one programming operation may include 23 pulses, i.e. 23 programming voltages increasing gradually are applied. The initial programming voltage is about 12V and the increment step is about 0.4V. For example, after the first 6 pulses, the L1 state may be verified; after 7 to 10 pulses, the L2 state may be verified; and after 11 to 13 pulses, the L2 to L4 states may be verified. The verification strategy of the second verification operation depends on the amplitudes of the pulses and characteristics of the memory cells. The memory cells having passed verification will be inhibited from being programmed to avoid over programming. The first verification operation is performed before the second verification operation, and the strategy and opportunity of application of the first verification operation may be the same as those of the second verification operation to alleviate the control burden on the peripheral circuit 302 or may be different from those of the second verification operation. As shown in combination with FIG. 8, the first verification operation may be performed after application of the initial programming voltage Vpgm0 in the first programming operation or may be performed after a programming voltage having been increased a few times, for example, after Vpgm4.

In some implementations, the target states of the first memory cells may be the L2, L3 or any other programmed state, and the first verification voltages of the first verification operation for the first memory cells of programmed states other than the L1 state may all be E1. The second verification voltages of the second verification operation may be different from E1 and may be different for different programmed states. With the L2 state taken as an example, the verification voltage of the second verification operation corresponding to the first memory cells of the L2 state may be E3 and the first verification voltage of the first verification operation may use the verification voltage E1 of the second verification operation corresponding to the L1 state. At this point, the verification voltages of the two verification operations are different from each other with E3 being larger than E1. In some other implementations, the first verification voltage of the first verification operation for the first memory cells of programmed states other than the L1 state may be the same as the second verification voltage of the second verification operation. With the L2 state taken as an example, the second verification voltage of the second verification operation is E3, the first verification voltage of the first verification operation may also be E3, and the first threshold remains the same because E3 is larger than E1. At this point, if the first number of the second memory cells each having the erased state as the target state and having a threshold voltage larger than E3 is larger than the first threshold, the number of the second memory cells each having the erased state as the target state and having a threshold voltage larger than E1 is also larger than the first threshold and the programming fails; and if the first number is smaller than or equal to the first threshold, the interference to the programming of the L2 state is low.

In some implementations, when a first memory cell has a high state as the target state, programming can be performed step by step from a low state to the high state and verification operations can be performed step by step. The target state of a first memory cell may refer to the highest programmed state, which can be reached during the process of programming the first memory cell into the target state. When the second verification operation is performed after the programming operation of the first memory cells, the verification voltage applied in the second verification operation is the first verification voltage. The first verification voltage is not the last verification voltage used when the first memory cells are programmed into their target states finally. The programmed state corresponding to the first verification voltage is neither the target state of the first memory cells nor the highest programmed state during programming of the first memory cells. However, the second number of the first memory cells each having a threshold voltage smaller than the first verification voltage may also be smaller than the second threshold. At this point, the first memory cells pass the verification with the first verification voltage and reach the programmed state corresponding to the current first verification voltage rather than the target state. The programming voltage needs to be increased to continue the programming of the first memory cells, i.e. programming of subsequent higher states.

In some implementations, the second number is smaller than the second threshold and the first verification voltage is just the verification voltage corresponding to the target state of the first memory cells, so that the first memory cells reach the highest programmed state, i.e. the target state, the programming operation succeeds and a second identifier indicating success of programming is generated. In some examples, as shown in connection with FIG. 9, the target state of the first memory cells may be the L3 state and the first verification voltage may be the verification voltage E1 corresponding to the L1 state. After a programming voltage is applied to the first memory cells, the first number is smaller than or equal to the first threshold. The second verification operation is performed using the first verification voltage E1. When the second number is smaller than the second threshold, the second verification operation succeeds. At this point, the first memory cells only have reached the L1 state but not the L3 state yet, and the programming voltage needs to be increased to continue the programming. The verification voltage of the second verification operation is increased until the first memory cells pass the second verification operation using the verification voltage E5 and a second identifier is generated to indicate success of the programming. During the process of programming the first memory cells into the state L3, the L2 state may be gone through and the L3 state is the highest programmed state. When the second number is larger than or equal to the second threshold, the second verification operation fails and the first memory cells have not reached the L1 state. The programming voltage is further increased to make the second number smaller than the second threshold. The programming voltage and the verification voltage are increased subsequently to program the first memory cells into the highest programmed state L3. In some other examples, the target state of the first memory cells is the L3 state and the first verification voltage is E5. When the second number is smaller than the second threshold, the second programming operation succeeds and the first memory cells reach the highest programmed state L3. When the second number is larger than or equal to the second threshold, the second programming operation fails and the programming voltage is increased to make the second number smaller than the second threshold.

In some implementations, the threshold voltage distribution of the first memory cells corresponds to at least one programmed state after programming and the first programmed state is a programmed state adjacent to the erased state. The target state of each of the first memory cells is configured to be the L1 state, L2 state, L3 state or one of the higher programmed states. For example, with respect to QLC, the target state of each of the first memory cells is configured to be one of the L1 to L15 states. The first verification voltage of the first verification operation is the verification voltage E1 for the L1 state. Before the second verification operation for the L1 state of the first memory cells, the first verification operation is first performed. If the first number of the second memory cells, each of which has the erased state as the target state and a threshold voltage larger than E1, is larger than the first threshold, the programming fails. If the first number is smaller than or equal to the first threshold, the second verification operation is performed. When the second number of the first memory cells each having a threshold voltage smaller than E1 is smaller than the second threshold, the L1 state passes the verification. The memory cells having passed the verification for the L1 state are inhibited from being programmed. For the memory cells each having any other state as the target state, the programming voltage is increased to continue programming and the second verification operation is performed using the verification voltages corresponding to the individual programmed states until all the target states pass the verification and the programming operation is terminated.

In some implementations, in a memory block, the number of the memory cells, each of which is coupled to the first word line and has the erased state as the target state, is the third number. The ratio of the first threshold to the third number is within a first preset range.

The first threshold may be a set value obtained by performing various performance and parameter tests on the memory device 104 during the ex-factory testing phase of memory device 104 and the memory system 102 and be written into a certain memory region of the memory device 104, so that when the memory device 104 is powered on, the data can be loaded into a related register for calling by a control logic. Illustratively, the first threshold may be determined according to the third number of the memory cells each having the erased state as the target state, for example, may be 0~10% of the third number of the memory cells each having the erased state as the target state. So, the first preset range may be 0~10%.

In some implementations, the memory block further includes third memory cells, a number of reads of which is larger than or equal to a preset number.

The third memory cells are not applied with any programming voltage in the first programming operation and may be on a different word line from the one, on which the first memory cells are located. Alternatively, the third memory cells and the first memory cells are on the same word line and correspond to different memory regions, in which read and programming operations can be performed separately. The preset number may be a set value obtained by performing tests during the ex-factory testing phase of memory device 104 and the memory system 102 and be written into a certain memory region of the memory device 104, so that when the memory device 104 is powered on it can be loaded into a related register or buffer of the memory controller 106 for calling by the memory controller 106. The preset number may be set for times in a range including 1000~2000. When an open memory block of the memory device 104 is read a number of times with the number being larger than or equal to the preset number, it is considered that the shifts of the threshold voltages of the erased state are relatively large due to the read interference, which may lead to failure of programming or reading errors. The first verification operation is performed and, if the verification operation fails, the programming operation may quit in time and an operation corresponding to failure of programming is performed, improving the operating efficiency of the memory device 104.

In some implementations, the memory block further includes third memory cells, a number of reads of which is smaller than the preset number. The peripheral circuit 302 is further configured to:

in response to a second operation command, perform the second programming operation to program fourth memory cells in the memory block; and perform the second verification operation, wherein the fourth memory cells are those in the erased state and with a non-erased state as the target state. The third memory cells are not applied with any programming voltage in the second programming operation and the fourth memory cells may be on a different word line from the one, on which the third memory cells are located. Alternatively, the fourth memory cells and the third memory cells are on the same word line and correspond to different memory regions, in which read and programming operations can be performed separately.

When the number of reads of the third memory cells in an open memory block of the memory device 104 is smaller than a preset number, the shifts of the threshold voltages of the erased state due to the read interference are considered relatively small and interference to programming operations is relatively small. The first verification operation for programming will not performed on the fourth memory cells in the open memory block anymore, and the second programming operation may be performed on the fourth memory cells. A programming voltage is applied on the fourth memory cells and then the second verification operation is performed on them to determine whether the target states are reached. FIG. 8 may be referred to for the manner, in which the programming voltages are applied in the second programming operation and the first programming operation. The same timing may be used to apply pulses, and the same initial programming voltage Vpgm0 and the same increment step of voltage ΔV may be used, so that the control burden on the peripheral circuit 302 may be alleviated and fewer modifications to the programming operation firmware are needed.

Figure 13:
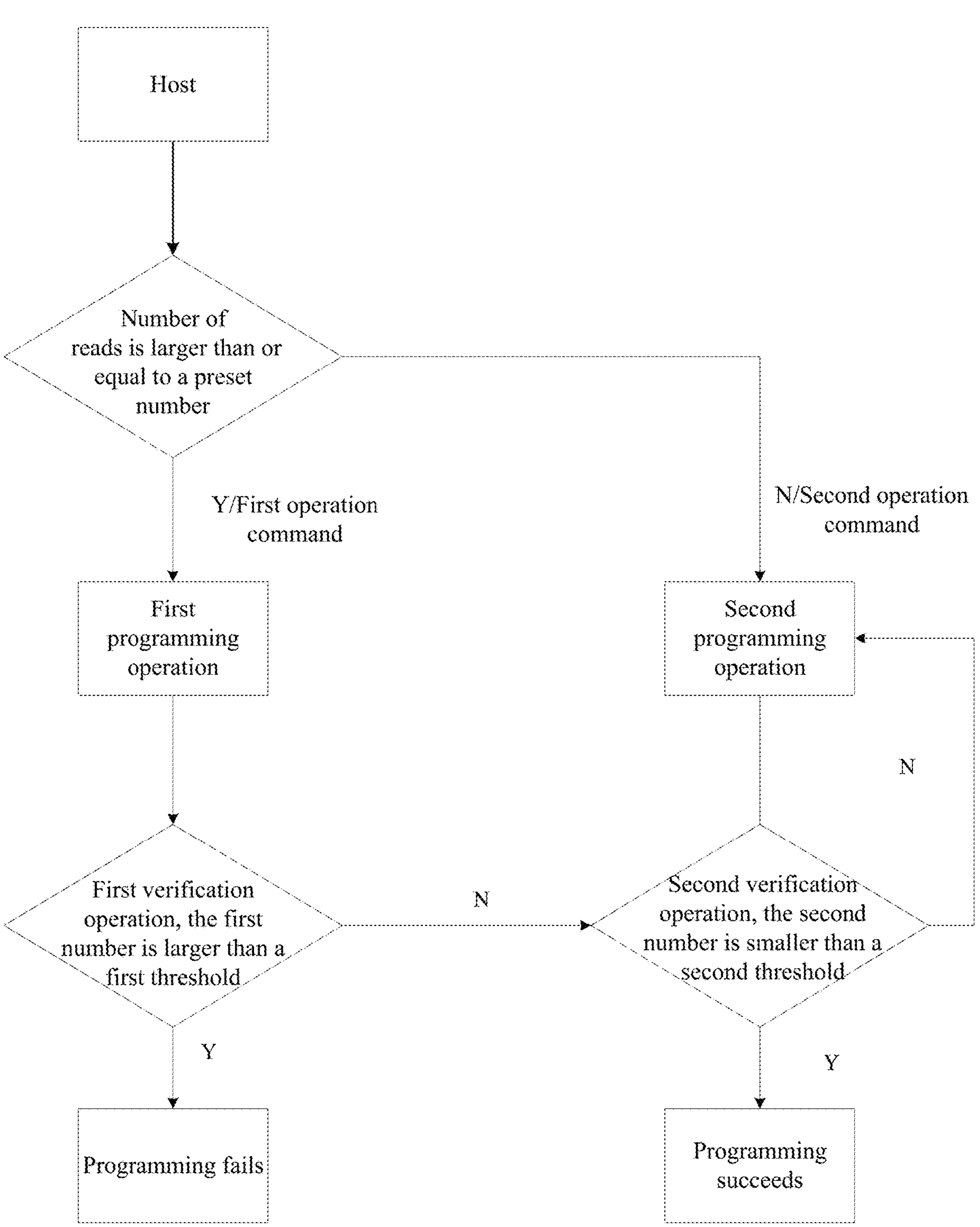
FIG. 13 shows a flow chart of programming operations of a memory system according to an implementation of the disclosure.

In some examples, as shown in FIG. 13, when the memory controller 106 receives a write request from the host 108 or when internal management such as garbage collection, bad-block management or wear leveling is performed on the internal memory blocks in the memory device 104 without any write request from the host 108, a programming operation is performed on the memory device 104 and the memory controller 106 obtains the number of times the third memory cells in an open memory block to be programmed are read with the data of the number being generated by the peripheral circuit 302 or the memory controller 106 recording a historical number of reads. The memory controller 106 compares the historical number of reads of on the open memory block with a preset number. When the historical number of reads of in the open memory bock is larger than or equal to the preset number, the memory controller 106 sends a first operation command including flag information to the memory device 104. The flag information may include first flag information configured to direct the memory device 104 to perform the first programming operation and second flag information configured to direct the memory device 104 to perform the first verification operation. After receiving the first operation command, the memory device 104 performs the first programming operation on the first memory cells and performs the first verification operation to determine the number of the second memory cells, each of which has the erased state as the target state and a threshold voltage larger than the first verification voltage. If the first number is larger than the first threshold, the programming operation fails and if the first number is smaller than or equal to the first threshold, the second verification operation is performed. If the second number of the first memory cells each having a threshold voltage smaller than the verification voltage of the second verification operation after the first programming operation is smaller than the second threshold, the programming succeeds. If the second number is larger than or equal to the second threshold, the programming voltage is increased and the programming is continued using the first programming operation or the second programming operation until the second number is smaller than the second threshold. The pulses of the programming voltages for the second programming operation and the first programming operation may take the same timing.

When the historical number of reads of the third memory cells in the open memory block is smaller than the preset number, the memory controller 106 sends a second operation command including a third flag information to the memory device 104 with the third flag information configured to direct execution of the second programming operation and execution of the second verification operation, or a fourth flag information is configured to direct execution of the second verification operation. The memory device 104 receives the second operation command, performs the second programming operation on the fourth memory cells in the open memory block and performs the second verification operation. Alternatively, the second operation command may include the first flag information and the fourth flag information.

In an implementation of the present disclosure, the first verification operation of the memory device 104 may be performed before the first programming operation. That is, a first verification voltage may be applied to the first memory cells before a programming voltage is applied to the first memory cells, to perform the first verification operation. Alternatively, the first verification operation may be performed by applying the first verification voltage after the first programming operation is performed, i.e. after one or more programming voltages are applied. In this way, the original timing for application of programming voltages and verification voltages may be still used and modifications to the original programming operation firmware may be reduced. The execution order of the first verification operation and the first programming operation may be controlled by the memory device 104 under an operation command sent from the memory controller 106 to the memory device 104.

In some aspects of implementations of the present disclosure, as shown in FIGS. 1, a memory system 102 is provided, the memory system including: a memory controller 106 configured to send a first operation command; and a memory device 104 coupled to the memory controller 106. The memory device 104 includes a memory block including a plurality of memory cells, a plurality of word lines coupled to the memory block. The memory device 104 is configured to: perform a first programming operation in response to a first operation command to program first memory cells coupled to a first word line in the memory block; perform a first verification operation to obtain the first number of second memory cells in the memory block that are coupled to the first word line, the second memory cells being those coupled to the first word line, having an erased state as the target state and having a threshold voltage larger than a first verification voltage, which is a verification voltage of the first programmed state; and generate a first state identifier indicating programming failure in response to the first number being larger than a first threshold.

In some implementations, the memory block may include an open memory block.

The memory controller 106 is configured to: send the first operation command to the memory device 104, wherein the first operation command includes flag information used to direct the first memory cells coupled to the first word line in the open memory block to be programmed and direct the first verification operation to be performed; obtain the first number of the second memory cells coupled to the first word line in the open memory block, wherein the second memory cells are memory cells each having the erased state as the target state and a threshold voltage larger than the first verification voltage, and the first verification voltage is the verification voltage of the first programmed state; and obtain a first state identifier indicating failure of programming. The flag information may include first flag information and second flag information. The first flag information is used to direct the memory device 104 to perform the first programming operation and the second flag information is used to direct the memory device 104 to perform the first verification operation.

In some implementations, the memory device 104 is configured to: receive the first operation command; perform the first programming operation to program the first memory cells coupled to the first word line in the open memory block; perform the first verification operation to obtain the first number; and in response to the first number being larger than the first threshold, generate the first state identifier configured to indicate failure of programming. The memory device 104 may send the first state identifier to the memory controller 106 actively or feed a feedback signal generated based on the first state identifier back to the memory controller 106. The memory controller 106 may also access the memory device 104 through an I/O interface, obtain the first state identifier and enter a response operation flow to cope with the failure of programming.

In some implementations, the memory device 104 is further configured to: in response to the first number being smaller than or equal to the first threshold, perform the second verification operation to obtain the second number of the first memory cells with a threshold voltage smaller than the first verification voltage; and in response to the second number being smaller than a second threshold and the first programmed state being the highest state, generate a second state identifier to indicate that the programming succeeds. The memory device 104 may send the second state identifier to the memory controller 106 actively or feed a feedback signal generated based on the second state identifier back to the memory controller 106. The memory controller 106 may also access the memory device 104 through an I/O interface and obtain the second state identifier.

In some implementations, the memory device 104 is further configured to: in response to the first programmed state not being the highest state, continue the programming using the ISPP programming method. In response to the second number being smaller than the second threshold and the first programmed state having not reached the highest state, the voltage value of the programming voltage is increased to continue the programming on the first memory cells and the voltage value of the verification voltage for the second verification operation is increased to continue the verification on the first memory cells until the second number is smaller than the second threshold and the first memory cells reach the highest programmed state.

In some implementations, the memory device 104 is further configured to: in response to the second number being larger than or equal to the second threshold, increase the voltage value of the programming voltage to continue the programming on the first memory cells until the second number is smaller than the second threshold and the first memory cells reach the highest programmed state; and generate the second state identifier.

In some implementations, in a memory block, the number of the memory cells, each of which is coupled to the first word line and has the erased state as the target state, is the third number, wherein the ratio of the first threshold to the third number is within a first preset range.

In some implementations, the threshold voltage distribution of the first memory cells corresponds to at least one programmed state after programming and the first programmed state is a programmed state adjacent to the erased state.

In some implementations, the open memory block further includes third memory cells, and the memory controller 106 is further configured to: in response to the number of reads of the third memory cells being larger than or equal to a preset number, send the first operation command.

In some implementations, the memory block further includes the third memory cells, and the memory controller 106 is further configured to: in response to the number of reads of the third memory cells being smaller than the preset number, send a second operation command. The memory device 104 is further configured to: receive the second operation command, perform the second programming operation to program fourth memory cells in the memory block, and perform the second verification operation, wherein the fourth memory cells are those in the erased state and with a non-erased state as the target state.

Figure 14:
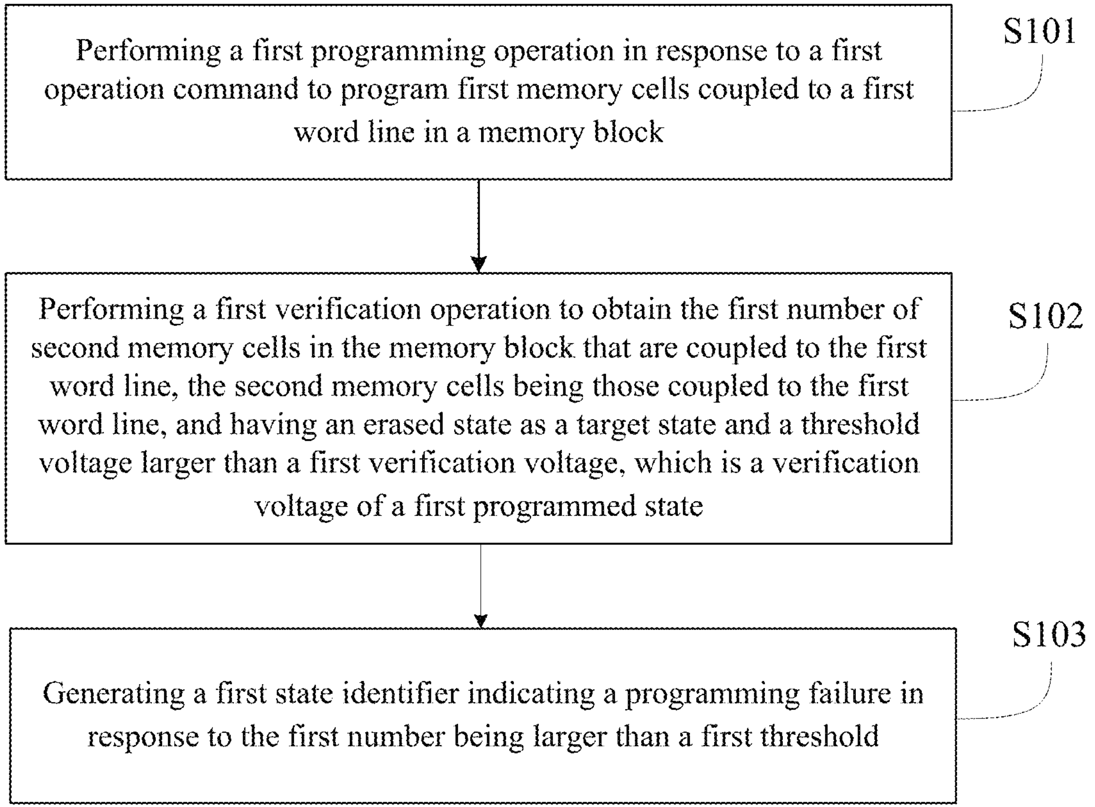
FIG. 14 shows a schematic diagram of a control method flow for a memory device according to an implementation of the disclosure.

In some aspects of implementations of the present disclosure, FIG. 14 provides a method of controlling the memory device 104, the method including: performing a first programming operation in response to a first operation command to program first memory cells coupled to a first word line in a memory block; performing a first verification operation to obtain the first number of second memory cells in the memory block that are coupled to the first word line, the second memory cells being those coupled to the first word line, having an erased state as the target state and a threshold voltage larger than a first verification voltage, which is a verification voltage of the first programmed state;

and generating a first state identifier indicating programming failure in response to the first number being larger than a first threshold.

In some implementations, the memory block includes an open memory block.

In some implementations, the control method further includes: in response to the first number being smaller than or equal to the first threshold, performing the second verification operation to obtain the second number of the first memory cells with a threshold voltage smaller than the first verification voltage; and in response to the second number being smaller than a second threshold and the first programmed state being the highest state, generating a second state identifier to indicate that the programming succeeds.

In some implementations, the control method further includes: in response to the first programmed state not being the highest state, continuing the programming using the ISPP programming method. In response to the second number being smaller than the second threshold and the first programmed state having not reached the highest state, the voltage value of the programming voltage is increased to continue the programming on the first memory cells and the voltage value of the verification voltage for the second verification operation is increased to continue the verification on the first memory cells until the second number is smaller than the second threshold and the first memory cells reach the highest programmed state.

In some implementations, the control method further includes: in response to the second number being larger than or equal to the second threshold, increasing the voltage value of the programming voltage to continue the programming on the first memory cells until the second number is smaller than the second threshold and the first memory cells reach the highest programmed state; and generating the second state identifier.

In some implementations, in a memory block, the number of the memory cells, each of which is coupled to the first word line and has the erased state as the target state, is the third number, wherein the ratio of the first threshold to the third number is within a first preset range.

In some implementations, the threshold voltage distribution of the first memory cells corresponds to at least one programmed state after programming and the first programmed state is a programmed state adjacent to the erased state.

In some implementations, the number of reads of the third memory cells in the memory block is larger than or equal to a preset number.

In some implementations, the control method further includes: in response to a second operation command, performing the second programming operation to program fourth memory cells in the memory block; and performing the second verification operation, wherein the number of reads of the third memory cells in the memory block is smaller than the preset number, and the fourth memory cells are those in the erased state and with a non-erased state as the target state.

Figure 15:
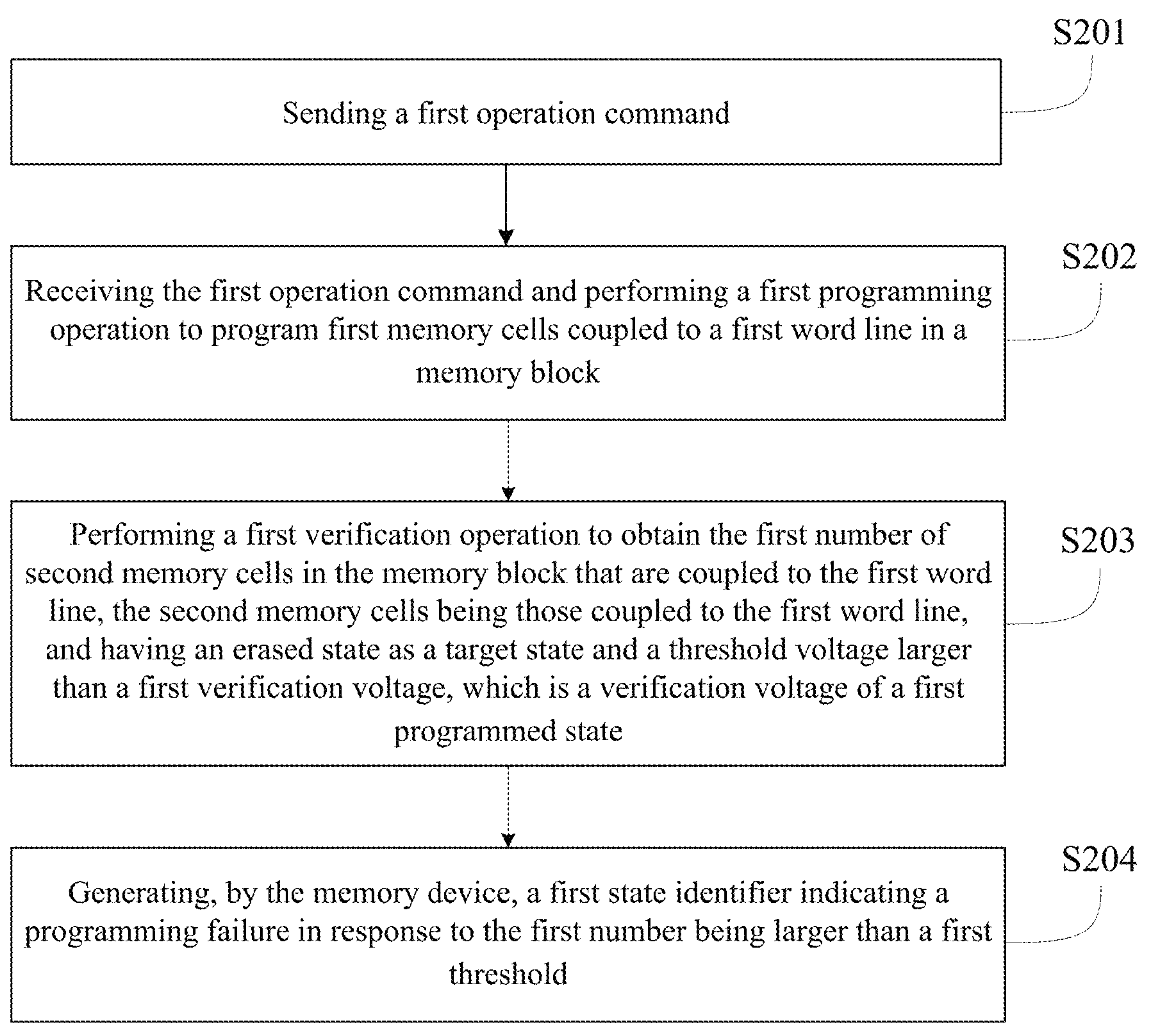
FIG. 15 shows a schematic diagram of a control method flow for a memory system according to an implementation of the present disclosure.

In some aspects of implementations of the present disclosure, FIG. 15 provides a method of controlling the memory system 102, the method including: sending a first operation command; receiving the first operation command and performing a first programming operation to program first memory cells coupled to a first word line in a memory block; performing a first verification operation to obtain the first number of second memory cells in the memory block that are coupled to the first word line, the second memory cells being those coupled to the first word line, having an erased state as the target state and a threshold voltage larger than a first verification voltage, which is a verification voltage of the first programmed state; and generating, by the memory device, a first state identifier indicating programming failure in response to the first number being larger than a first threshold.

In some implementations, the memory block includes an open memory block.

In some implementations, the control method further includes: in response to the first number being smaller than or equal to the first threshold and by the memory device 104, performing the second verification operation to obtain the second number of the first memory cells with a threshold voltage smaller than the first verification voltage; and in response to the second number being smaller than a second threshold and the first programmed state being the highest state, generating a second state identifier to indicate that the programming succeeds.

In some implementations, the control method further includes: in response to the first programmed state not being the highest state, continuing the programming using the ISPP programming method. In response to the second number being smaller than the second threshold and the first programmed state having not reached the highest state, the voltage value of the programming voltage is increased to continue the programming on the first memory cells and the voltage value of the verification voltage for the second verification operation is increased to continue the verification on the first memory cells until the second number is smaller than the second threshold and the first memory cells reach the highest programmed state.

In some implementations, the control method further includes: in response to the second number being larger than or equal to the second threshold, increasing the voltage value of the programming voltage to continue the programming on the first memory cells until the second number is smaller than the second threshold and the first memory cells reach the highest programmed state; and generating the second state identifier.

In some implementations, in a memory block, the number of the memory cells, each of which is coupled to the first word line and has the erased state as the target state, is the third number, wherein the ratio of the first threshold to the third number is within a first preset range.

In some implementations, the threshold voltage distribution of the first memory cells corresponds to at least one programmed state after programming and the first programmed state is a programmed state adjacent to the erased state.

In some implementations, the control method further includes: in response to the number of reads of the third memory cells in the memory block being larger than or equal to a preset number, sending the first operation command by the memory controller 106.

In some implementations, the control method further includes: in response to the number of reads of the third memory cells in the memory block being smaller than the preset number, sending a second operation command by the memory controller 106; by the memory device 104, receiving the second operation command and performing the second programming operation to program fourth memory cells in the memory block; and performing the second verification operation, wherein the fourth memory cells are those in the erased state and with a non-erased state as the target state.

In some aspects of the implementations of the present disclosure, a readable storage medium is provided, the medium storing computer programs, which, when being executed, implements the control methods.

The memory device 104 may include a NAND memory including memory cells. The memory cells may include memory cells of a floating-gate type, each of which includes a floating-gate transistor, or memory cells of a charge trapping type, each of which includes a charge trapping transistor.

The storage medium may be a ferroelectric random access memory (FRAM), a magnetic random access memory (MRAM), a read-only memory (RAM), a programmable read-only memory (PROM), an erasable programmable read-only memory (EPROM), an electrically erasable programmable read-only memory (EEPROM), a flash memory, a magnetic surface memory, an optical disc, a compact disc read-only memory (CD-ROM) or any other memory; or the storage medium may be any of various apparatuses including one or any combination of the above-described memory devices 104.

In some implementations, the executable instructions may take the form of a program, software, a software module, a script or codes, be written in any programming language (including a compiled or interpreted language or a declarative or procedural language) and be deployed in any form such as an independent program, or a module, an assembly, a sub routine or any other unit suitable for use in a computing environment.

As an example, the executable instructions may, but not necessarily, correspond to a file in a file system, may be stored as a portion of a file storing another program or other data, for example, stored in one or more scripts of a Hyper Text Markup Language (HTML) document, in a single file dedicated to the discussed program, or in multiple collaborative files (e.g., a file storing one or more modules, sub-routines or code sections).

For example, the executable instructions may be deployed to be executed on one electronic apparatus or on multiple electronic apparatuses located in the same place or on multiple apparatuses distributed in multiple places and interconnected through a communication network.

According to some aspects of implementations of the present disclosure, a memory device is provided, which includes: a memory block including a plurality of memory cells; a plurality of word lines coupled to the memory block; and a peripheral circuit coupled to the plurality of word lines and configured to: perform a first programming operation in response to a first operation command to program first memory cells coupled to a first word line in the memory block; perform a first verification operation to obtain the first number of second memory cells in the memory block that are coupled to the first word line, the second memory cells being those coupled to the first word line, having an erased state as the target state and a threshold voltage larger than a first verification voltage, which is the verification voltage of the first programmed state; and generate a first state identifier indicating programming failure in response to the first number being larger than a first threshold.

In some implementations, the memory block includes an open memory block.

In some implementations, the peripheral circuit is further configured to: in response to the first number being smaller than or equal to the first threshold, perform the second verification operation to obtain the second number of the first memory cells with threshold voltages smaller than the first verification voltage; and in response to the second number being smaller than a second threshold and the first programmed state being the highest state, generate a second state identifier to indicate that the programming succeeds.

In some implementations, the peripheral circuit is further configured to: in response to the first programmed state not being the highest state, continue the programming using the ISPP (Increment Step Pulse Programming) programming method.

In some implementations, in a memory block, the number of the memory cells, each of which is coupled to the first word line and has the erased state as the target state, is a third number, wherein the ratio of the first threshold to the third number is within a first preset range.

In some implementations, the threshold voltage distribution of the first memory cells corresponds to at least a programmed state after programming, and the first programmed state is a programmed state adjacent to the erased state.

In some implementations, the memory block includes third memory cells, a number of reads of which is larger than or equal to a preset number.

In some implementations, the memory block includes the third memory cells, a number of reads of which is smaller than the preset number, and the peripheral circuit is further configured to: in response to a second operation command, perform a second programming operation to program fourth memory cells in the memory block; and perform the second verification operation, wherein the fourth memory cells are those in the erased state and with a non-erased state as the target state.

According to some aspects of implementations of the present disclosure, a memory system is provided, which comprises: a memory controller configured to send a first operation command; and a memory device coupled to the memory controller, including a memory block, which includes a plurality of memory cells, and a plurality of word lines coupled to the memory block. The memory device is configured to: perform a first programming operation in response to a first operation command to program first memory cells coupled to a first word line in the memory block; perform a first verification operation to obtain the first number of second memory cells in the memory block that are coupled to the first word line, the second memory cells being those coupled to the first word line, having an erased state as the target state and a threshold voltage larger than a first verification voltage, which is a verification voltage of the first programmed state; and generate a first state identifier indicating programming failure in response to the first number being larger than a first threshold.

In some implementations, the memory block includes an open memory block.

In some implementations, the memory device is further configured to: in response to the first number being smaller than or equal to the first threshold, perform the second verification operation to obtain the second number of the first memory cells with threshold voltages smaller than the first verification voltage; and in response to the second number being smaller than a second threshold and the first programmed state being the highest state, generate a second state identifier to indicate that the programming succeeds.

In some implementations, the memory device is further configured to: in response to the first programmed state not being the highest state, continue the programming using the ISPP programming method.

In some implementations, in a memory block, the number of the memory cells, each of which is coupled to the first word line and has the erased state as the target state, is the third number, wherein the ratio of the first threshold to the third number is within a first preset range.

In some implementations, the threshold voltage distribution of the first memory cells corresponds to at least one programmed state after programming, and the first programmed state is a programmed state adjacent to the erased state.

In some implementations, the memory block includes third memory cells, and the memory controller is further configured to: in response to the number of reads of the third memory cells being larger than or equal to a preset number, send the first operation command.

In some implementations, the memory block includes the third memory cells, and the memory controller is further configured to: in response to the number of reads of the third memory cells being smaller than the preset number, send a second operation command. The memory device is further configured to: receive the second operation command, perform the second programming operation to program fourth memory cells in the memory block, and perform the second verification operation, wherein the fourth memory cells are those in the erased state and with a non-erased state as the target state.

According to some aspects of implementations of the present disclosure, a method of controlling a memory device is provided, which includes: performing a first programming operation in response to a first operation command to program first memory cells coupled to a first word line in a memory block; performing a first verification operation to obtain the first number of second memory cells in the memory block that are coupled to the first word line, the second memory cells being those coupled to the first word line, having an erased state as the target state and a threshold voltage larger than a first verification voltage, the first verification voltage being the verification voltage of the first programmed state; and generating a first state identifier indicating programming failure in response to the first number being larger than a first threshold.

In some implementations, the memory block includes an open memory block.

In some implementations, the control method further includes: in response to the first number being smaller than or equal to the first threshold, performing the second verification operation to obtain the second number of the first memory cells with a threshold voltage smaller than the first verification voltage; and in response to the second number being smaller than a second threshold and the first programmed state being the highest state, generating a second state identifier to indicate that the programming succeeds.

In some implementations, the control method further includes: in response to the first programmed state not being the highest state, continuing the programming using the ISPP programming method.

In some implementations, in the memory block, the number of the memory cells, which are coupled to the first word line and have the erased state as the target state, is a third number, wherein the ratio of the first threshold to the third number is within a first preset range.

In some implementations, the threshold voltage distribution of the first memory cells corresponds to at least a programmed state after programming and the first programmed state is a programmed state adjacent to the erased state.

In some implementations, the number of reads of the third memory cells in the memory block is larger than or equal to a preset number.

In some implementations, the control method further includes: in response to a second operation command, performing the second programming operation to program fourth memory cells in the memory block; and performing the second verification operation, wherein the number of reads of the third memory cells in the memory block is smaller than the preset number, and the fourth memory cells are those in the erased state and with a non-erased state as the target state.

According to some aspects of implementations of the present disclosure, a method of controlling a memory system is provided, which includes: sending a first operation command; receiving the first operation command and performing a first programming operation to program first memory cells coupled to a first word line in a memory block; performing a first verification operation to obtain the first number of second memory cells in the memory block that are coupled to the first word line, the second memory cells being those coupled to the first word line, having an erased state as the target state and a threshold voltage larger than a first verification voltage, the first verification voltage being the verification voltage of the first programmed state; and generating, by the memory device, a first state identifier indicating programming failure in response to the first number being larger than a first threshold.

In some implementations, the memory block includes an open memory block.

In some implementations, the control method further includes: in response to the first number being smaller than or equal to the first threshold, and by the memory device, performing the second verification operation to obtain the second number of the first memory cells with a threshold voltage smaller than the first verification voltage; and in response to the second number being smaller than a second threshold and the first programmed state being the highest state, generating a second state identifier to indicate that the programming succeeds.

In some implementations, the control method further includes: in response to the first programmed state not being the highest state, continuing the programming using the ISPP programming method.

In some implementations, in a memory block, the number of the memory cells, each of which is coupled to the first word line and has the erased state as the target state, is the third number wherein the ratio of the first threshold to the third number is within a first preset range.

In some implementations, the threshold voltage distribution of the first memory cells corresponds to at least a programmed state after programming, and the first programmed state is a programmed state adjacent to the erased state.

In some implementations, the control method further includes: in response to the number of reads of the third memory cells in the memory block being larger than or equal to a preset number, sending the first operation command by the memory controller.

In some implementations, the control method further includes: in response to the number of reads of the third memory cells in the memory block being smaller than the preset number, sending a second operation command by the memory controller; by the memory device, receiving the second operation command and performing the second programming operation to program fourth memory cells in the memory block; and performing the second verification operation, wherein the fourth memory cells are those in the erased state and with a non-erased state as the target state.

In some aspects of the implementations of the present disclosure, a readable storage medium is provided, which, when being executed, implements the control method.

Implementations of the present disclosure provide a memory device. The peripheral circuit performs a first programming operation in response to a first operation command to program first memory cells coupled to a first word line in a memory block. A first verification operation is performed to obtain the first number of second memory cells coupled to the first word line in the memory block. The second memory cells are memory cells, each of which has an erased state as the target state and a threshold voltage larger than a first verification voltage. The first verification voltage is the verification voltage of a first programmed state. In response to the first number being larger than a first threshold, a first state identifier indicating programming failure is generated. By comparing the first number with the first threshold, the first verification operation may reflect how the shifts of threshold voltages of the memory cells before programming exert influence on the programming operation. The first number being larger than the first threshold indicates that the shifts of threshold voltages of the memory cells before programming exert a relatively high interference on the programming operation. The programming operation can quit in time and a corresponding operation dealing with programming failure can be performed to improve the operating efficiency of the memory device.

What have been described above are only implementations of the present disclosure. However, the scope of the present disclosure is not limited thereto, and variations or substitutions that easily occur to those skilled in the art in light of the technical contents disclosed by the present disclosure will fall within the scope of implementations of the present disclosure.

What is claimed is:

1. A memory device, comprising:
- a memory block including memory cells;
- a plurality of word lines coupled to the memory block; and
  - a peripheral circuit coupled to the plurality of word lines and configured to:
- perform a first programming operation in response to a first operation command to program first memory cells coupled to a first word line in the memory block;
  - perform a first verification operation to obtain a first number of second memory cells in the memory block that are coupled to the first word line, the second memory cells being those coupled to the first word line and having an erased state as a target state and a threshold voltage larger than a first verification voltage, wherein the first verification voltage is a verification voltage of a first programmed state; and
  - generate a first state identifier indicating a programming failure in response to the first number being larger than a first threshold, wherein the first operation command is received by the peripheral circuit in response to a number of reads of third memory cells in the memory block being larger than or equal to a preset number.

2. The memory device of claim 1, wherein the memory block includes an open memory block.

3. The memory device of claim 1, wherein the peripheral circuit is further configured to:
- in response to the first number being smaller than or equal to the first threshold, perform a second verification operation to obtain a second number of the first memory cells with the threshold voltage smaller than the first verification voltage; and
- in response to the second number being smaller than a second threshold and the first programmed state being a highest state, generate a second state identifier to indicate a programming success.

4. The memory device of claim 3, wherein the peripheral circuit is further configured to, in response to the first programmed state not being the highest state, continue the programming using an Increment Step Pulse Programming (ISPP) programming method.

5. The memory device of claim 3, wherein, when the number of reads of the third memory cells is smaller than the preset number, the peripheral circuit is further configured to:
- in response to a second operation command, perform a second programming operation to program fourth memory cells in the memory block; and
- perform the second verification operation, wherein the fourth memory cells are in the erased state and the target state is a non-erased state.

6. The memory device of claim 1, wherein, in the memory block, a number of memory cells coupled to the first word line and have the erased state as the target state is a third number, and wherein a ratio of the first threshold to the third number is within a first preset range.

7. The memory device of claim 1, wherein a threshold voltage distribution of the first memory cells corresponds to at least one programmed state after programming and the first programmed state is a programmed state adjacent to the erased state.

8. A memory system, comprising:
- a memory controller configured to send a first operation command; and
- a memory device coupled to the memory controller, wherein the memory device includes a memory block including a plurality of memory cells, and a plurality of word lines are coupled to the memory block, and
- the memory device is configured to:
  - perform a first programming operation in response to the first operation command to program first memory cells coupled to a first word line in the memory block;
  - perform a first verification operation to obtain a first number of second memory cells in the memory block that are coupled to the first word line, the second memory cells being those coupled to the first word line and having an erased state as a target state and a threshold voltage larger than a first verification voltage, wherein the first verification voltage is a verification voltage of a first programmed state; and
  - generate a first state identifier indicating a programming failure in response to the first number being larger than a first threshold, wherein the first operation command is sent to the memory device in response to a number of reads of third memory cells in the memory block being larger than or equal to a preset number.

9. The memory system of claim 8, wherein the memory block includes an open memory block.

10. The memory system of claim 9, wherein the memory device is further configured to:
- in response to the first number being smaller than or equal to the first threshold, perform a second verification operation to obtain a second number of the first memory cells with the threshold voltage smaller than the first verification voltage; and in response to the second number being smaller than a second threshold and the first programmed state being a highest state, generate a second state identifier to indicate a programming success.

11. The memory system of claim 10, wherein the memory device is further configured to, in response to the first programmed state not being the highest state, continue the programming using an Increment Step Pulse Programming (ISPP) programming method.

12. The memory system of claim 10, wherein the memory controller is further configured to:

in response to the number of reads of the third memory cells being smaller than the preset number, send a second operation command; and the memory device is further configured to:

receive the second operation command;

perform a second programming operation to program fourth memory cells in the memory block; and perform the second verification operation, wherein the fourth memory cells are in the erased state and the target state is a non-erased state.

13. The memory system of claim 8, wherein, in the memory block, a number of memory cells that are coupled to the first word line and have the erased state as the target state is a third number, and wherein a ratio of the first threshold to the third number is within a first preset range.

14. The memory system of claim 8, wherein a threshold voltage distribution of the first memory cells corresponds to at least one programmed state after programming and the first programmed state is a programmed state adjacent to the erased state.

15. A method of controlling a memory device, comprising:

performing a first programming operation in response to a first operation command to program first memory cells coupled to a first word line in a memory block;

performing a first verification operation to obtain a first number of second memory cells in the memory block that are coupled to the first word line, the second memory cells being those coupled to the first word line and having an erased state as a target state and a threshold voltage larger than a first verification voltage, wherein the first verification voltage is a verification voltage of a first programmed state; and generating a first state identifier configured to indicate a programming failure in response to the first number being larger than a first threshold, wherein the first operation command is sent to the memory device in response to a number of reads of third memory cells in the memory block being larger than or equal to a preset number.

16. The method of claim 15, wherein the memory block includes an open memory block.

17. The method of claim 15, further including:

in response to the first number being smaller than or equal to the first threshold, performing a second verification operation to obtain a second number of the first memory cells with the threshold voltage smaller than the first verification voltage; and in response to the second number being smaller than a second threshold and the first programmed state being a highest state, generating a second state identifier to indicate a programming success.

18. The method of claim 17, wherein, when the number of reads of the third memory cells is smaller than the preset number, the method further includes:

in response to a second operation command, performing a second programming operation to program fourth memory cells in the memory block; and performing the second verification operation, wherein the fourth memory cells are in the erased state and the target state is a non-erased state.

19. The method of claim 15, wherein a threshold voltage distribution of the first memory cells corresponds to at least one programmed state after programming, and the first programmed state is a programmed state adjacent to the erased state.

20. The method of claim 15, wherein, in the memory block, a number of memory cells are coupled to the first word line and have the erased state as the target state is a third number, and wherein a ratio of the first threshold to the third number is within a first preset range.

* * * * *